(12) United States Patent
Huang et al.

(10) Patent No.: US 11,036,129 B2
(45) Date of Patent: Jun. 15, 2021

(54) PHOTOMASK AND METHOD FOR FORMING THE SAME

(71) Applicant: TAIWAN SEMICONDUCTOR MANUFACTURING COMPANY LTD., Hsinchu (TW)

(72) Inventors: Chung-Yang Huang, Chiayi County (TW); Hao-Ming Chang, Pingtung (TW); Ming Che Li, Hsinchu (TW); Yu-Hsin Hsu, Taichung (TW); Po-Cheng Lai, Hsinchu (TW); Kuan-Shien Lee, Taichung (TW); Wei-Hsin Lin, Hsinchu (TW); Yi-Hsuan Lin, Hsinchu (TW); Wang Cheng Shih, Hsinchu (TW); Cheng-Ming Lin, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 202 days.

(21) Appl. No.: 16/211,827

(22) Filed: Dec. 6, 2018

(65) Prior Publication Data

US 2020/0041894 A1    Feb. 6, 2020

Related U.S. Application Data

(60) Provisional application No. 62/712,464, filed on Jul. 31, 2018.

(51) Int. Cl.
*G03F 1/80* (2012.01)
*H01L 21/027* (2006.01)

(52) U.S. Cl.
CPC ............ *G03F 1/80* (2013.01); *H01L 21/0274* (2013.01)

(58) Field of Classification Search
None
See application file for complete search history.

(56) References Cited

U.S. PATENT DOCUMENTS 5,804,465 A * 9/1998 Banghart .......... H01L 27/14887
257/E27.162
8,173,506 B2   5/2012 Jung et al.
(Continued)

FOREIGN PATENT DOCUMENTS

| TW | 200952126 | 12/2009 |
| TW | I459446 B | 11/2014 |
| TW | 201725444 A | 7/2017 |

OTHER PUBLICATIONS

English Abstract Translation of Foreign Reference TW201725444.
(Continued)

*Primary Examiner* — Kathleen Duda
(74) *Attorney, Agent, or Firm* — WPAT, P.C., Intellectual Property Attorneys; Anthony King

(57) ABSTRACT

A method for forming a photomask includes receiving a substrate having a first layer formed thereon, wherein a patterned second layer exposing portions of the first layer is disposed over the substrate, removing the exposed portions of the first layer through the patterned second layer to form a plurality of openings in the first layer, removing the patterned second layer, and performing a wet etching to remove portions of the first layer to widen the plurality of openings with an etchant. The etchant is in contact with a top surface of the first layer and sidewalls of the plurality of openings. Each of the plurality of openings has a first width prior to the performing of the wet etching and a second width after the performing of the wet etching. The second width is greater than the first width.

20 Claims, 18 Drawing Sheets

(56) References Cited

U.S. PATENT DOCUMENTS

| | | |
|---|---|---|
| 8,222,132 B2 * | 7/2012 | Lee .................... H01L 29/7848 |
| | | 438/589 |
| 8,716,841 B1 | 5/2014 | Chang et al. |
| 8,736,084 B2 | 5/2014 | Cheng et al. |
| 8,796,666 B1 | 8/2014 | Huang et al. |
| 8,837,810 B2 | 9/2014 | Chen et al. |
| 9,093,530 B2 | 4/2015 | Huang et al. |
| 9,134,633 B2 | 9/2015 | Lin et al. |
| 9,230,867 B2 | 1/2016 | Chang et al. |
| 9,304,403 B2 | 4/2016 | Lin et al. |
| 9,404,743 B2 | 8/2016 | Chiu et al. |
| 9,548,303 B2 | 1/2017 | Lee et al. |
| 2009/0311842 A1 | 12/2009 | Kuo |
| 2016/0268442 A1 | 9/2016 | Hara et al. |
| 2017/0075213 A1 * | 3/2017 | Nagai ....................... G03F 1/32 |

OTHER PUBLICATIONS

U.S. Pat. No. 8,173,506 is the English counterpart application to Foreign Reference TW I459446 B.

US Patent Publication 20090311842 is the English counterpart application to Foreign Reference TW 200952126.

* cited by examiner

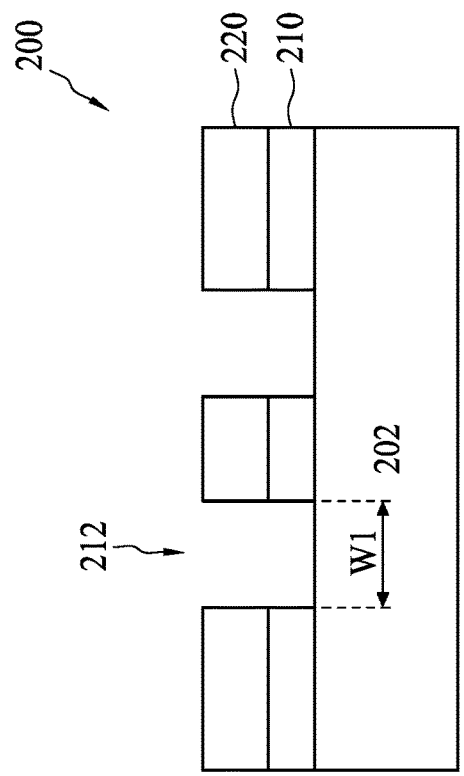
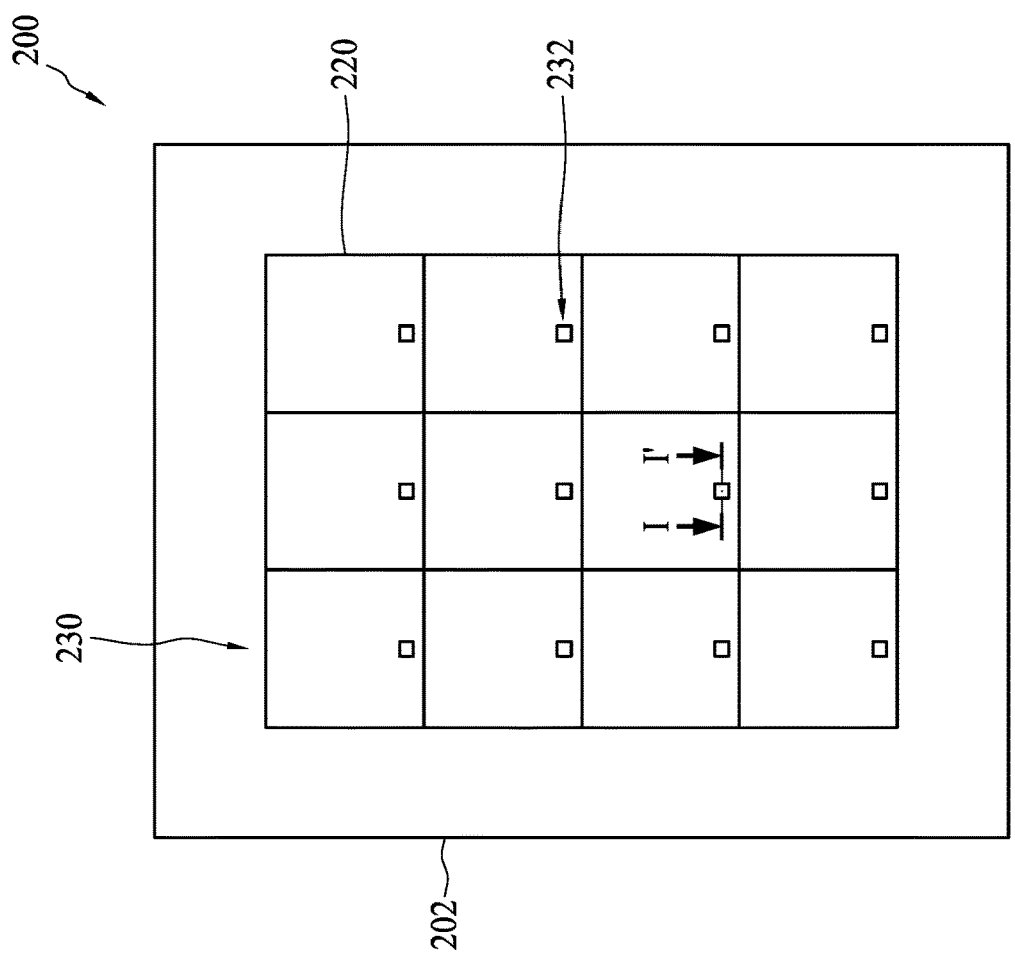
FIG. 5B
FIG. 5A

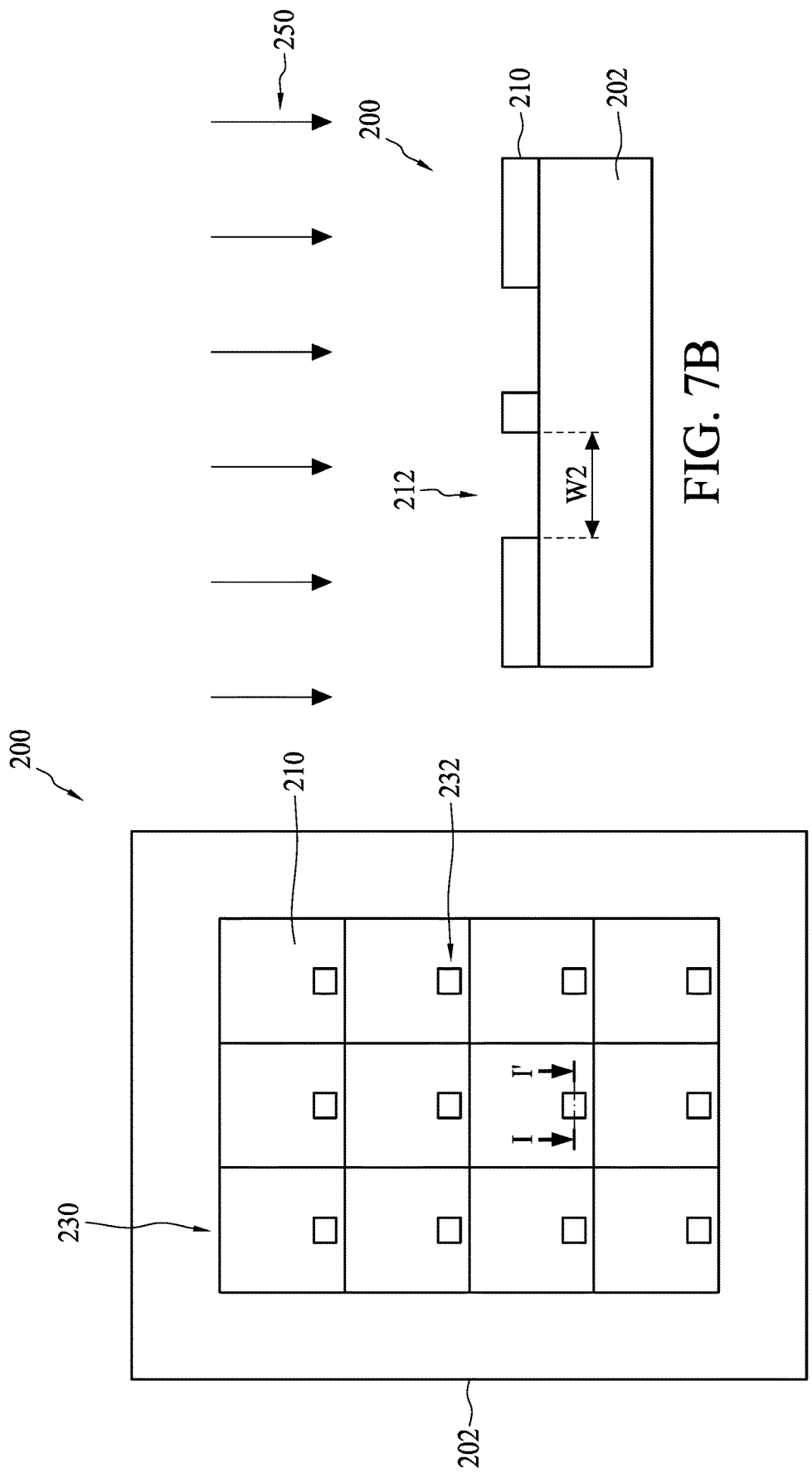

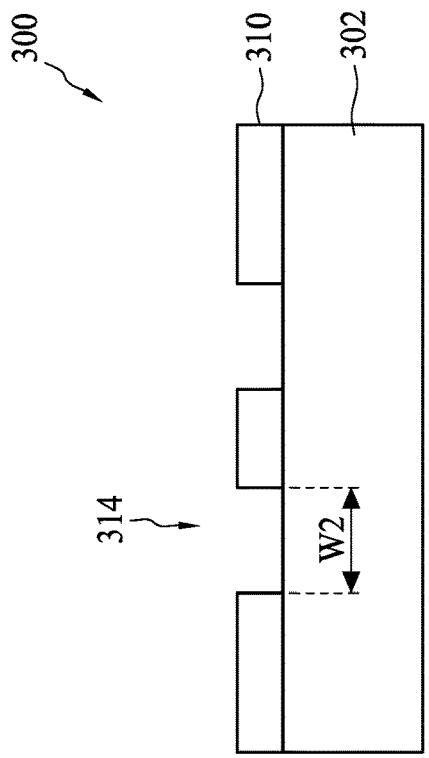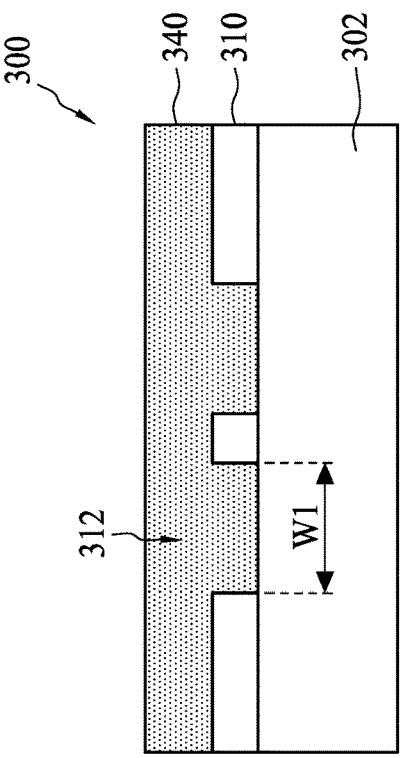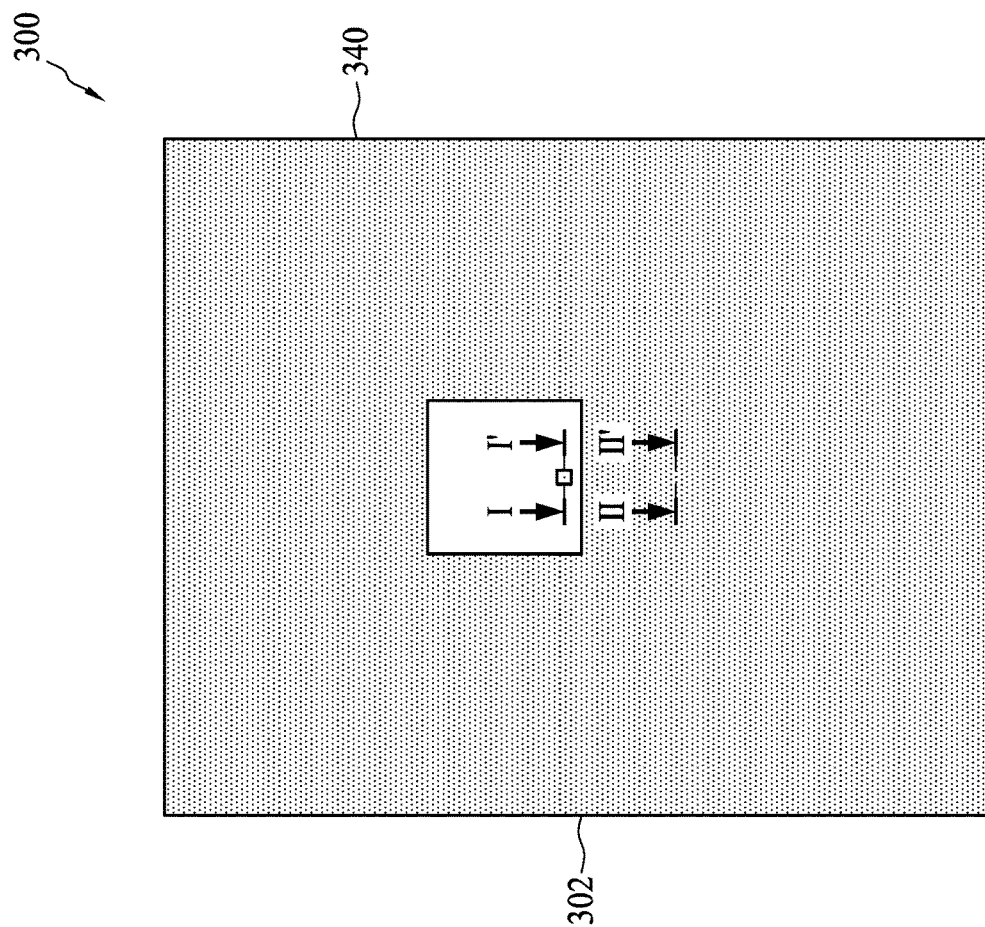

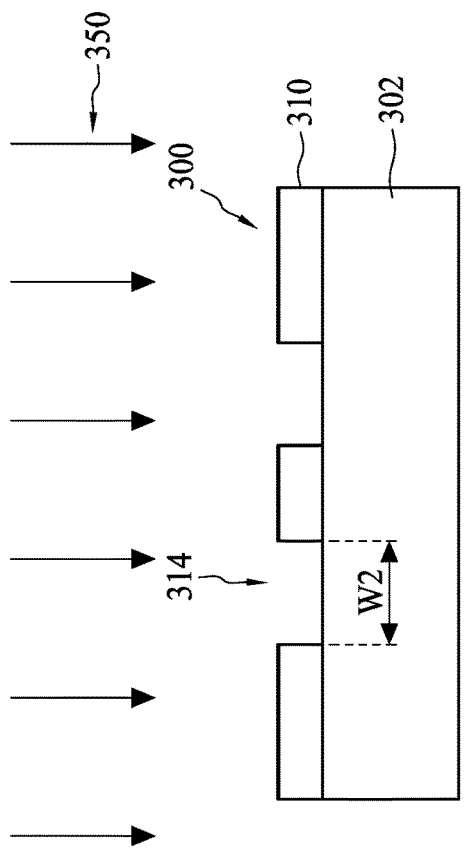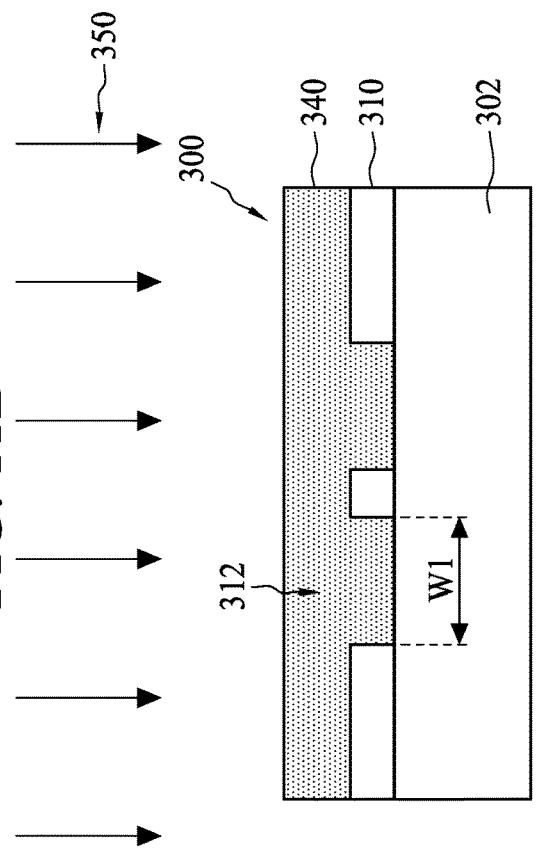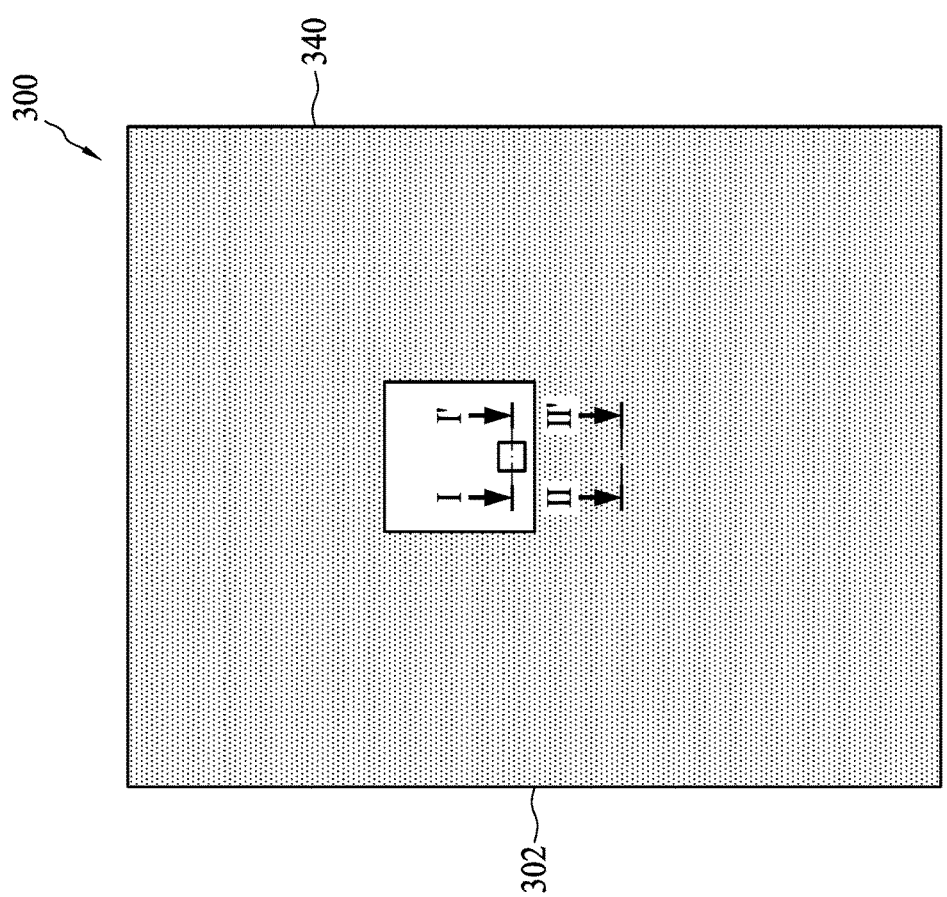

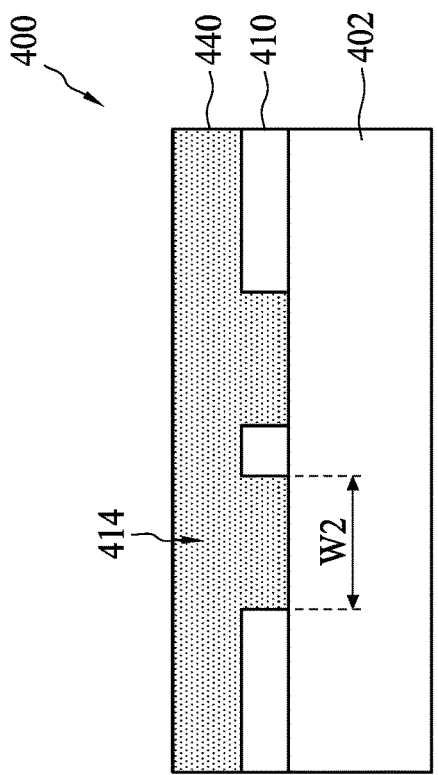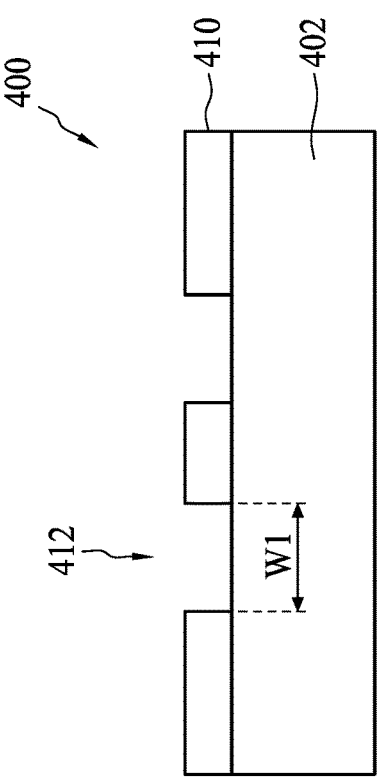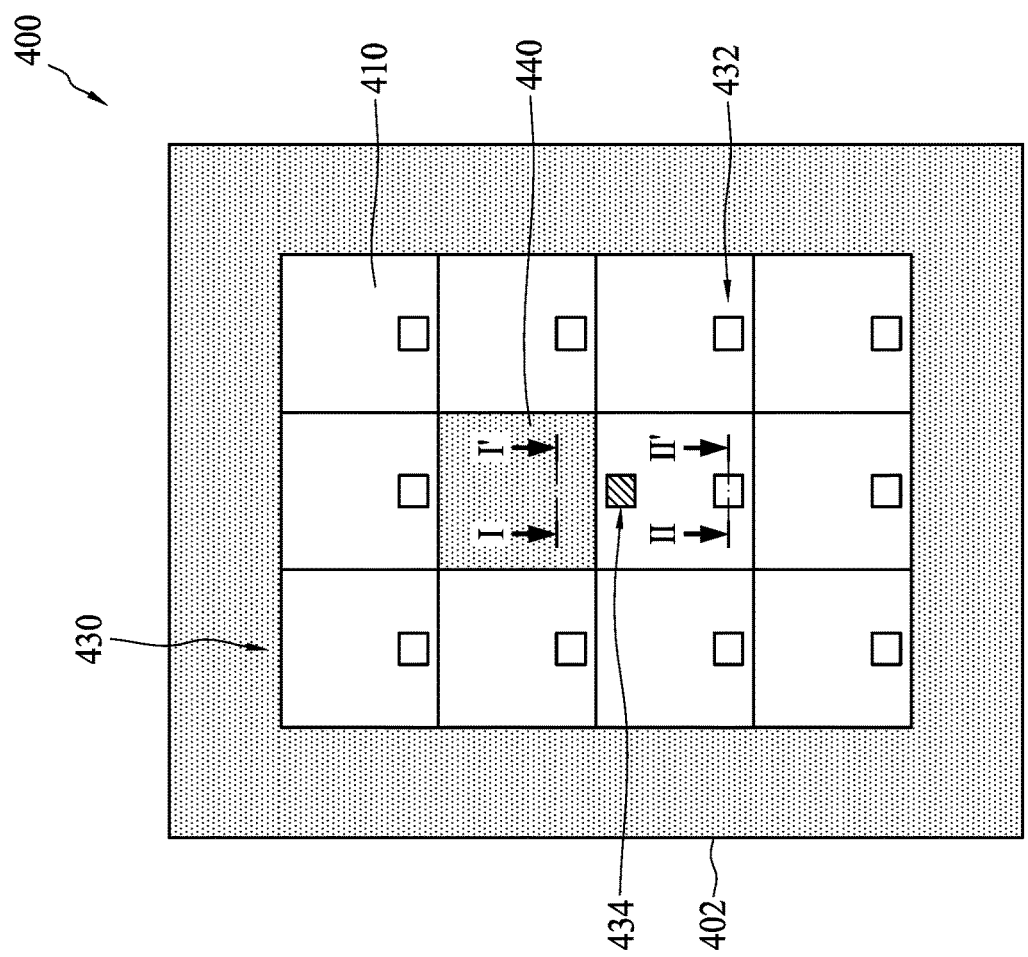
FIG. 14B
FIG. 14C
FIG. 14A

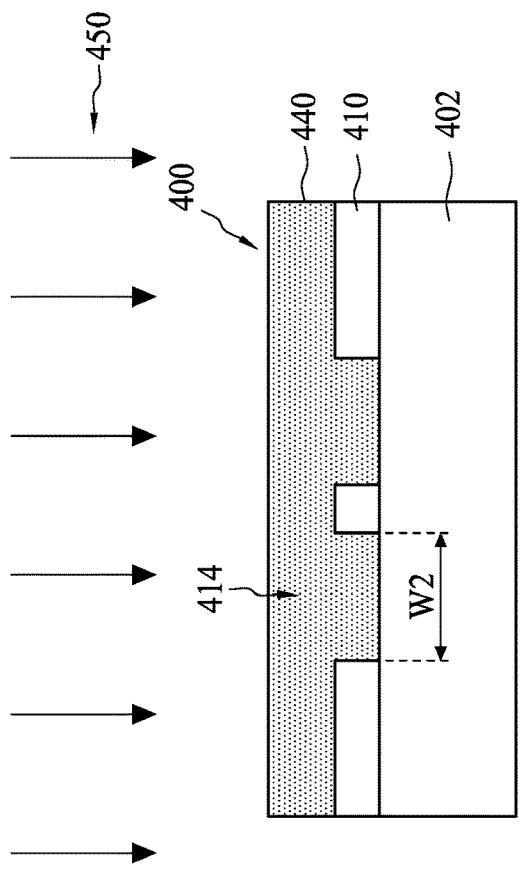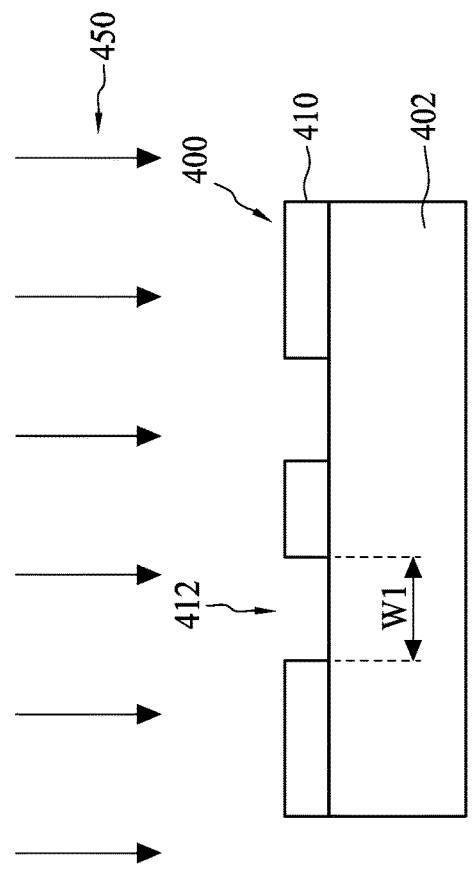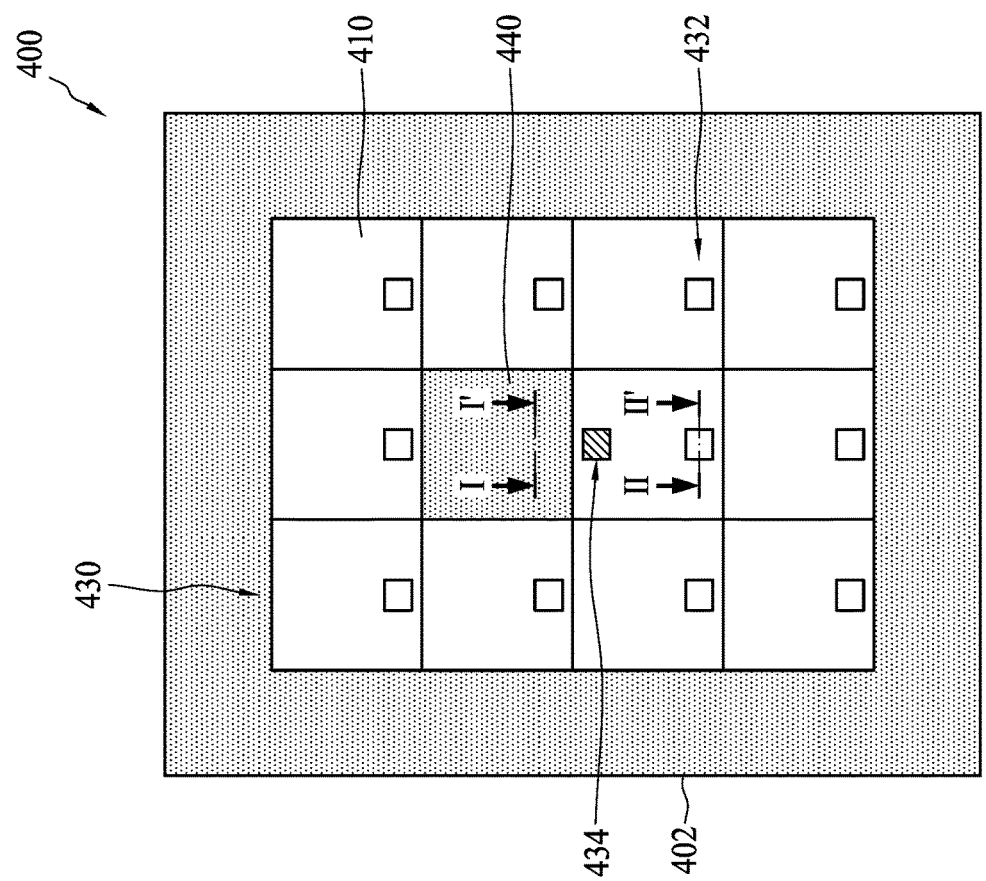

PHOTOMASK AND METHOD FOR FORMING THE SAME

PRIORITY DATA

This patent claims the benefit of U.S. Provisional Patent Application Ser. No. 62/712,464 filed Jul. 31, 2018, the entire disclosure of which is hereby incorporated by reference.

BACKGROUND

The semiconductor integrated circuit industry has experienced rapid growth in the past several decades. Technological advances in semiconductor materials and design have produced continuously smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask (also referred to as a mask or reticle) is often used. The photomask permits and prevents light in a desired pattern onto a layer of the wafer, such as a photoresist (PR) layer, which chemically reacts to the light exposure, removing some portions of the PR and leaving other portions. The remaining PR is then used to pattern an underlying layer. As feature sizes have decreased, the wavelength of light used in photolithography to pattern layers has decreased as well, creating additional difficulties and necessitating technological advances, such as the use of extreme ultraviolet (EUV) as a light source, and phase-shifting masks. Improving photomasks is important to facilitating continuing advances in the industry, in particular because imperfections in the patterned layer can be compounded during subsequent processing steps in the manufacture of semiconductor devices and integrated circuits. Photomask improvements, including improvements to the mask blank on which the photomask is derived and to the process of patterning the photomask, are therefore required.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A, 5A, 6A and 7A are schematic top views of a photomask at various fabrication stages constructed according to aspects of the present disclosure in one or more embodiments.

FIGS. 4B, 5B, 6B and 7B are partially enlarged cross-sectional views taken along a line I-I' of FIGS. 4A, 5A, 6A and 7A, respectively.

FIGS. 9A, 10A, 11A and 12A are schematic top views of a photomask at various fabrication stages constructed according to aspects of the present disclosure in one or more embodiments.

FIGS. 9B, 10B, 11B and 12B are partially enlarged cross-sectional views taken along a line I-I' of FIGS. 9A, 10A, 11A and 12A, respectively.

FIGS. 9C, 10C, 11C and 12C are partially enlarged cross-sectional views taken along a line II-II' of FIGS. 9A, 10A, 11A and 12A, respectively.

FIGS. 13A, 14A, 15A and 16A are schematic top views of a photomask at various fabrication stages constructed according to aspects of the present disclosure in one or more embodiments.

FIGS. 13B, 14B, 15B and 16B are partially enlarged cross-sectional views taken along a line I-I' of FIGS. 13A, 14A, 15A and 16A, respectively.

FIGS. 13C, 14C, 15C and 16C are partially enlarged cross-sectional views taken along a line II-II' of FIGS. 13A, 14A, 15A and 16A, respectively.

DETAILED DESCRIPTION

Figure 1:
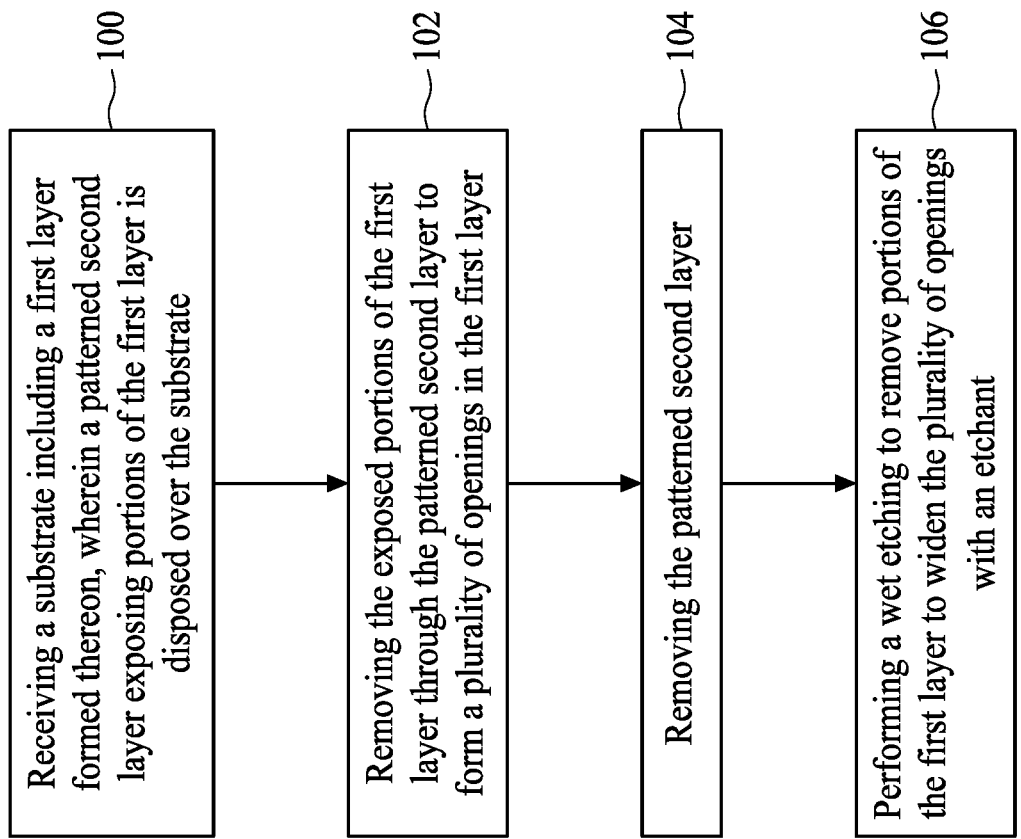
FIG. 1 is a flowchart representing a method for forming a photomask according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

A typical fabrication operation for a photomask may include imaging circuit patterns into a resist layer formed on a mask substrate (also referred to as mask blank), developing the resist layer, etching the resist layer, transferring the circuit patterns from the resist layer to an opaque or semi-transmissive layer, removing the resist layer, and checking critical dimension (CD) by SEM at after-etching inspection (AEI) or after-strip inspection (ASI). The quality of the photomask is observed at the AEI check or the ASI check, which are performed to obtain CD mean value and CD uniformity. A smaller variation of the CD usually indicates a higher quality of the photomask. The quality of the photomask is determined by an etching operation, which is used to transfer the circuit patterns to the opaque or semi-transmissive layer and thus determines the profiles (e.g., CD) of the etched layer.

When the size of the features or openings in the patterns does not meet a target value such as a CD requirement, defect is reported at the AEI check or the ASI check. Usually, two defect types may be found. When the feature or opening size is less than the target value, it is recognized as an under-size defect, or shrink type defect. When the feature or opening size is greater than the target value, it is recognized as an over-size defect, or bridge type defect. Further, when the under-size defect or the over-size defect is found in all pattern areas of the photomask, it is recognized as a global defect. When the under-size defect or the over-size defect is found in some pattern areas while other pattern areas of the photomask are free of the defects, it is recognized as a local defect. A photolithography process uses a photomask to transfer an IC design layout pattern to a wafer substrate by an optical exposing tool (such as a stepper or a scanner). Defects on the photomask pose challenges to the photolithography process. For example, when an unwanted pattern is formed on the wafer substrate, yield of the semiconductor manufacturing process is reduced, and the wafer may be scrapped because of the unwanted pattern.

The present disclosure therefore provides a method for forming a photomask. In some embodiments, a wet etching is used to remove global under-size defects. In some embodiments, a wet etching and a protecting layer are provided to remove local under-size defects. In some embodiments, a wet etching and a protecting layer are provided to improve pattern uniformity. Further, an adjustment mark is added so that an exposure energy dose can be adjusted according to the adjustment mark, and patterns transferred to the target layer can have feature or opening sizes that meet requirements.

It should be noted that in some embodiments, the terms "photomask," "mask" and "reticle" are used to refer to the same item. In some embodiments, the photomask can be a reflective mask such as that described in further detail below. In some embodiments, the photomask may incorporate other resolution-enhancement features, such as features of a phase-shifting mask (PSM) or optical proximity correction (OPC).

In some embodiments, the photomask can include a binary intensity mask (BIM) or a super binary intensity mask (SBIM), which generally contains patterned absorber films (such as chromium (Cr), chromium oxide (CrO), molybdenum (Mo) molybdenum silicon (MoSi) or silicon nitride (SiN)) on a highly polished quartz substrate. These absorber regions on the photomask absorb light so as to totally absorb or significantly attenuate light passing through the region. Thus, dark and light image patterns are projected from the mask onto a target, such as a semiconductor wafer.

In some embodiments, the photomask can include an attenuated phase shift mask (APSM) or a hard mask (HM) attenuated phase shift mask ((HM)APSM). The phase shift mask can include an attenuator, which is a metallic-like light absorbing film such as molybdenum silicide oxynitride (MoSiON) or chromium oxynitride (CrON) that allows 5-15% light transmittance. The partial transmittance of the light waves through the attenuator allows for phase-shifted light to be produced. APSM takes advantage of the interference effect in a coherent or partially coherent imaging system to reduce the spatial frequency of a given object, to enhance its edge contrast, or both. It is possible to locally control the type of interference, i.e., destructive or constructive, at critical locations in a design by adding an additional patterned layer of transmitting material to the mask. This technique results in a combination of higher resolution, greater exposure latitude, and greater depth of focus. In phase shift lithography, a transparent coating is placed over a transparent area. The light waves passing through the coated region are shifted 180° out of phase with the light waves passing through the uncoated region.

FIG. 1 is a flowchart of a method 10 for forming a photomask. The method 10 includes an operation 100 where a substrate is received. The substrate includes first layer formed thereon. In some embodiments, a patterned second layer can be disposed over the substrate. The patterned second layer exposes portions of the first layer. The method 10 further includes an operation 102 where the exposed portions of the first layer are removed through the patterned second layer to form a plurality of openings in the first layer. The method 10 further includes an operation 104 where the patterned second layer is removed. The method 10 further includes an operation 106 where a wet etching is performed to remove portions of the first layer to widen the plurality of openings with an etchant. In some embodiments, the etchant is in contact with a top surface of the first layer and sidewalls of the plurality of openings. Each of the plurality of openings has a first width prior to the performing of the wet etching and a second width after the performing of the wet etching, and the second width is greater than the first width. The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 2:
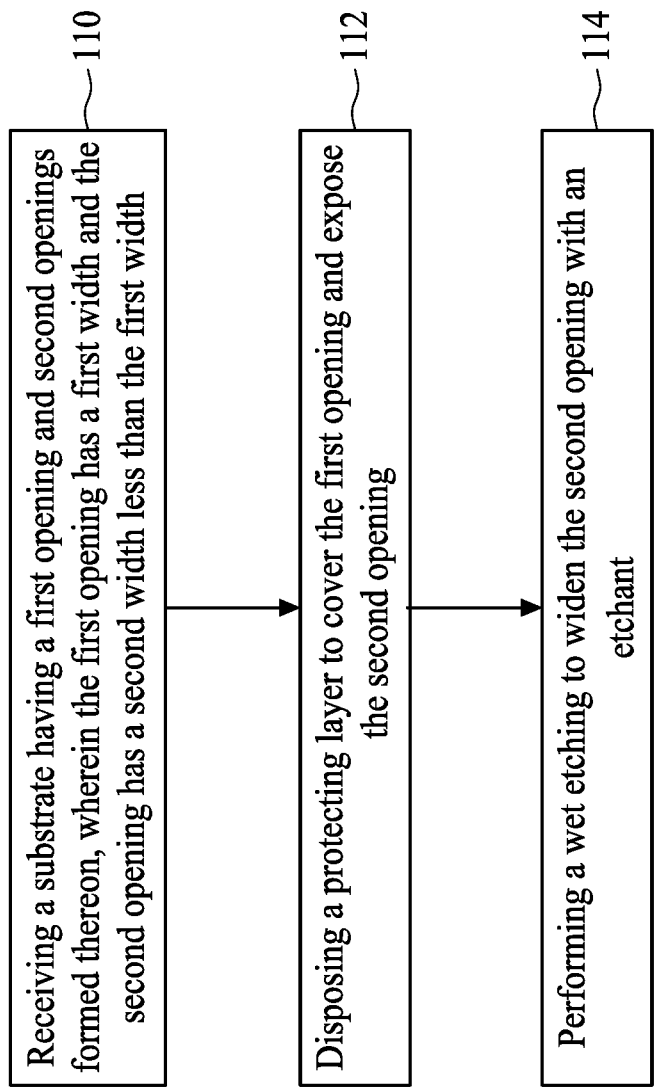
FIG. 2 is a flowchart representing a method for forming a photomask according to aspects of the present disclosure.

FIG. 2 is a flowchart of a method 11 for forming a photomask. The method 11 includes an operation 110 where a substrate having a first opening and a second opening formed thereon is received. In some embodiments, the first opening has a first width and the second opening has a second width less than the first width. The method 11 includes an operation 112 where a protecting layer is disposed to cover the first opening and expose the second opening. The method 11 further includes an operation 114 where a wet etching is performed to widen the second opening with an etchant. In some embodiments, the second opening has a third width after the performing of the wet etching, and the third width of the second opening is similar to the first width of the first opening. The method 11 will be further described according to one or more embodiments. It should be noted that the operations of the method 11 may be rearranged or otherwise modified within the scope of the various aspects. It should be further noted that additional processes may be provided before, during, and after the method 11, and that some other processes may be only briefly described herein. Thus, other implementations are possible within the scope of the various aspects described herein.

Figure 3:
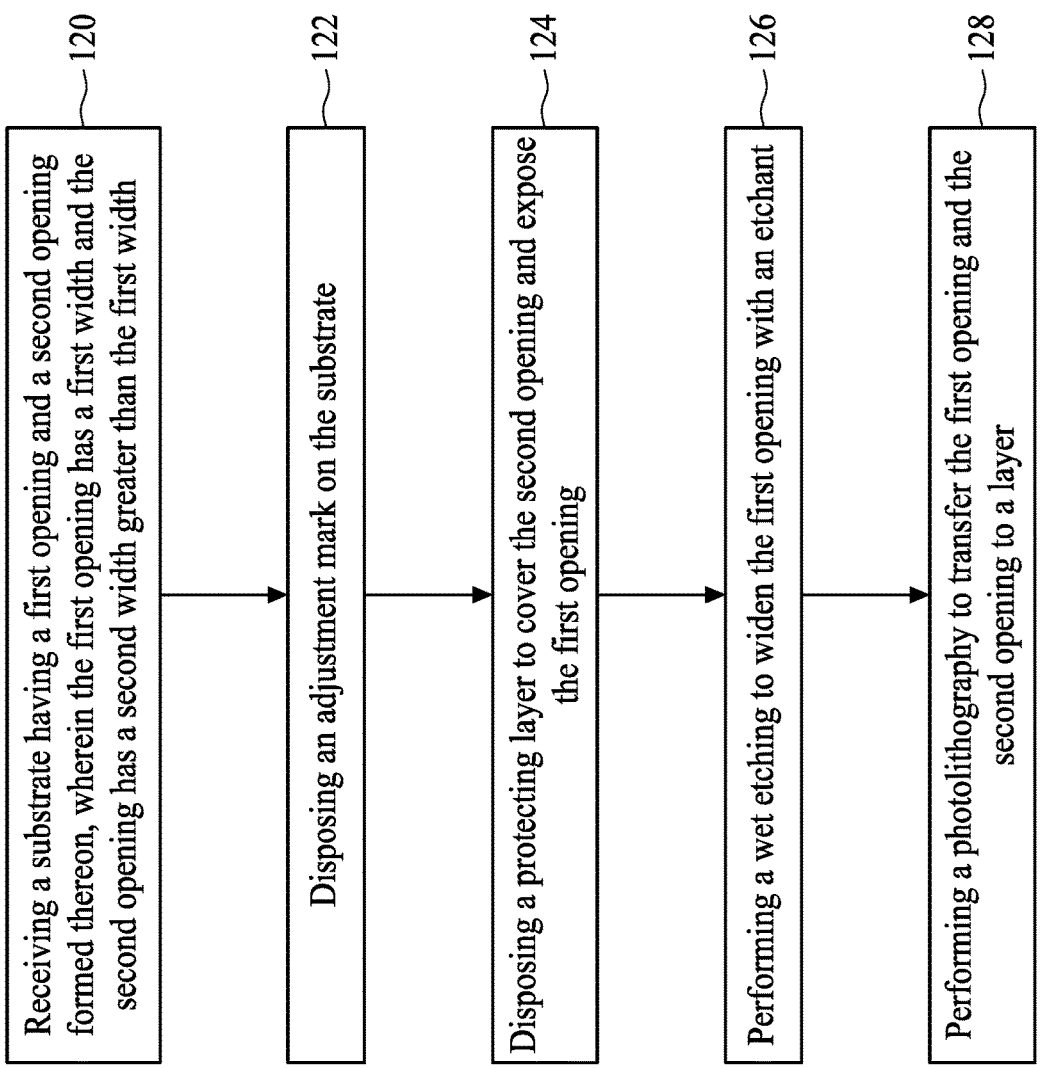
FIG. 3 is a flowchart representing a semiconductor manufacturing method according to aspects of the present disclosure.

FIG. 3 is a flowchart of a semiconductor manufacturing method 12. The method 12 includes an operation 120 where a substrate having a first opening and a second opening formed thereon is received. In some embodiments, the first opening has a first width and the second opening has a second width greater than the first width. The method 12 includes an operation 122 where an adjustment mark is disposed on the substrate. The method 12 includes an operation 124 where a protecting layer is disposed to cover the second opening and expose the first opening. The method 12 further includes an operation 126 where a wet etching is performed to widen the first opening with an etchant. In some embodiments, the first opening has a third width after the performing of the wet etching, and the third width of the first opening is similar to the second width of the second opening. The method 12 further includes an operation 128 where a photolithography is performed to transfer the first opening and the second opening to a layer. In some embodiments, an optimum exposure dose amount in the photolithography is determined by the adjustment mark. The method 12 will be further described according to one or more embodiments. It should be noted that the operations of the method 12 may be rearranged or otherwise modified within the scope of the various aspects. It should be further noted that additional processes may be provided before, during, and after the method 12, and that some other processes may be only briefly described herein. Thus, other implementations are possible within the scope of the various aspects described herein.

Figure 4B:
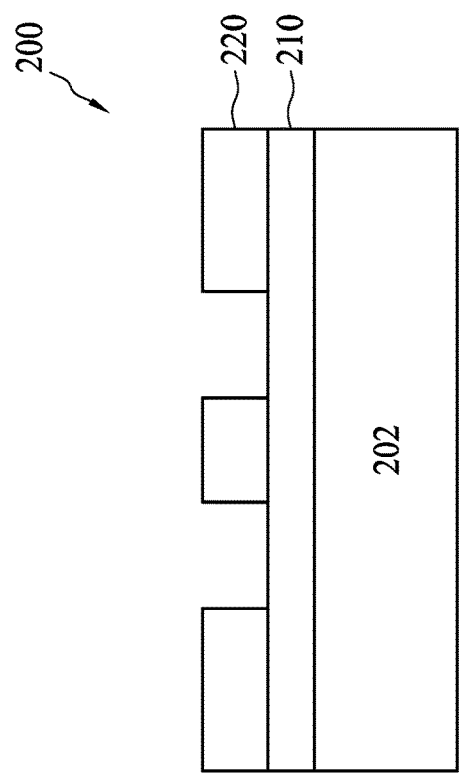
Figure 4A:
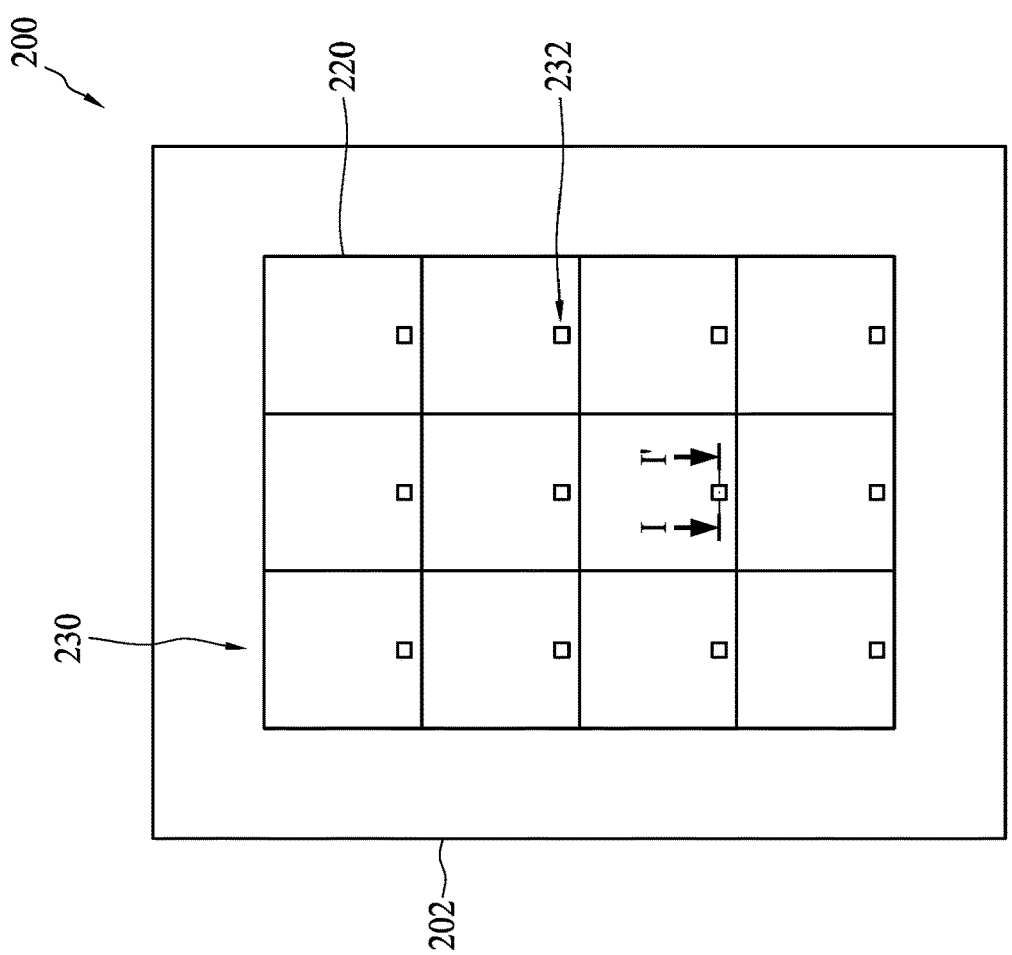

FIGS. 4A, 5A, 6A and 7A are top views illustrating a photomask 200 at various fabrication stages constructed according to aspects of the present disclosure in one or more embodiments, and FIGS. 4B, 5B, 6B and 7B are partially enlarged cross-sectional view taken along line I-I' of FIGS. 4A, 5A, 6A and 7A, respectively. As shown in FIGS. 4A and 4B, a substrate 202 is received or provided in operation 100. In some embodiments, the substrate 202 is a mask substrate that includes low thermal expansion material (LTEM) serving to minimize image distortion due to mask heating induced by intensified illumination radiation. In some embodiments, the LTEM may include silicon, quartz, fused silica, fused quartz, calcium fluoride (CaF), silicon carbide (SiC), silicon oxide-titanium oxide, and/or other suitable LTEM known in the art. Further, the mask substrate 202 may include materials with a low defect level and a smooth surface.

Still referring to FIGS. 4A and 4B, a first layer 210 such as a shielding layer 210 is formed over the mask substrate 202 in operation 100. In some embodiments, the first layer 210 includes chromium (Cr), chromium nitride (CrN), molybdenum-silicon-nitride (MoSiN), molybdenum silicide (MoSi), molybdenum silicon oxynitride (MoSiON), SiO or SiN, but the disclosure is not limited to these materials. In some embodiments, the first layer 210 can be a single-layer structure. In other embodiments, the first layer 210 can be a multi-layer structure, but the disclosure is not limited thereto. In some embodiments, a hard mask layer (not shown) can be formed on the first layer 210. The hard mask layer can include materials suitable to reflect or absorb light as required by the operation for forming the photomask. The hard mask layer can include Cr, CrN, chromium oxide (CrO), tantalum nitride (TaN), tantalum oxide (TaO) or tantalum oxynitride (TaON), but the disclosure is not limited thereto.

In some embodiments, a patterned second layer 220, such as a patterned photoresist 220, is formed on the first layer 210 in operation 100, as shown in FIGS. 4A and 4B. In some embodiments, a photoresist layer is formed on the first layer 210 and initially subjected to an exposure operation to form an exposed photoresist layer. The exposed photoresist layer is baked and then developed to form the patterned second layer 220. The patterned second layer 220 defines patterns for one die region or several die regions 230. In some embodiments, portions of the first layer 210 are exposed through the patterned second layer 220, as shown in FIG. 4B. In some embodiments, dummy patterns can be formed in the patterned second layer 220. For example, a dummy critical dimension (CD) target pattern 232 is formed in each of the die regions 230. The dummy CD target pattern 232 helps to analyze CD mean value and check CD uniformity. In some embodiments, a length of the dummy CD target pattern 232 is between approximately 1 μm and 5 μm, but the disclosure is not limited thereto.

Referring to FIGS. 5A and 5B, the exposed portions of the first layer 210 are removed through the patterned second layer 220 in operation 102. In some embodiments, the first layer 210 is subjected to a dry-etching operation, but the disclosure is not limited thereto. Thus, the patterns are transferred from the patterned second layer 220 to the first layer 210. Accordingly, the first layer 210 is patterned to have a plurality of openings 212 formed therein. Each of the plurality of openings 212 has a width W1. In other words, the patterned first layer 210 inherits the patterns for one die region or several die regions 230 from the patterned second layer 220, and also inherits the dummy target CD pattern 232, as shown in FIGS. 5A and 5B. After the forming of the plurality of openings 212, an after-etching inspection (AEI) may be performed and a clean operation can be subsequently performed.

Figure 6B:
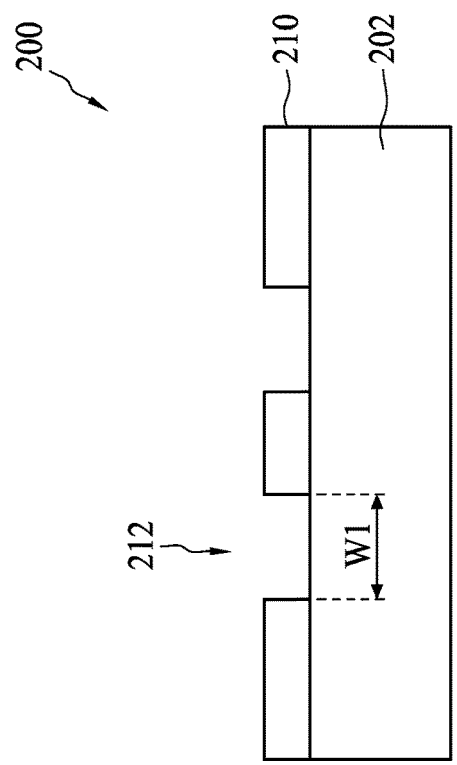
Figure 6A:
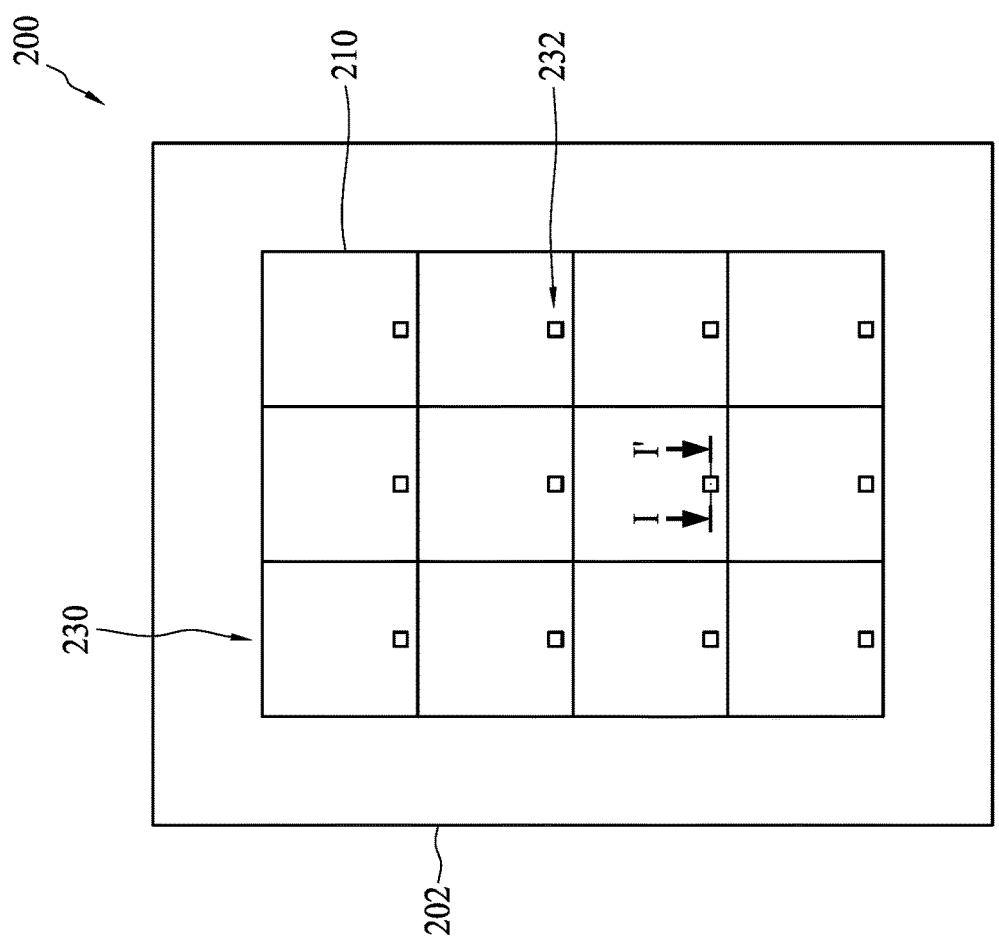

Referring to FIGS. 6A and 6B, next, the patterned second layer 220 is removed or stripped in operation 104. In some embodiments, the patterned second layer 220 is removed by deionized (DI) water and ozone ($O_3$), or ozonated DI water ($DIO_3$) and UV light. In some embodiments, the patterned second layer 220 is removed by DI water and $O_3$ and hydrogen ($H_2$), or DI water and tetramethylammonium hydroxide (TMAH) and $H_2$. In some embodiments, an ASI is performed after the removing of the patterned second layer 220. In some embodiments, an SEM system is utilized to provide an AEI image that reveals the dimensions of the patterns formed in the first layer 210. In some embodiments, an AEI image that reveals the dimensions of openings in each of the dummy CD target patterns 232 is provided. As mentioned above, the dummy CD target pattern 232 helps to analyze CD mean value and CD uniformity. In some embodiments, the dummy target CD pattern 232 serves as a representation of the pattern in each die region 230. In some embodiments, in the dummy target CD pattern 232, the first width W1 of the plurality of openings 212 is obtained, and the first with W1 of the plurality of openings 212 is compared with a target value. In some embodiments, when the first width W1 of the plurality of openings 212 is less than a target value, an under-size defect is recognized. In some embodiments, global under-size defects may be found in the dummy target CD patterns 232 in all die regions 230, as shown in FIGS. 6A and 6B, and thus a repair is required.

Figure 8:
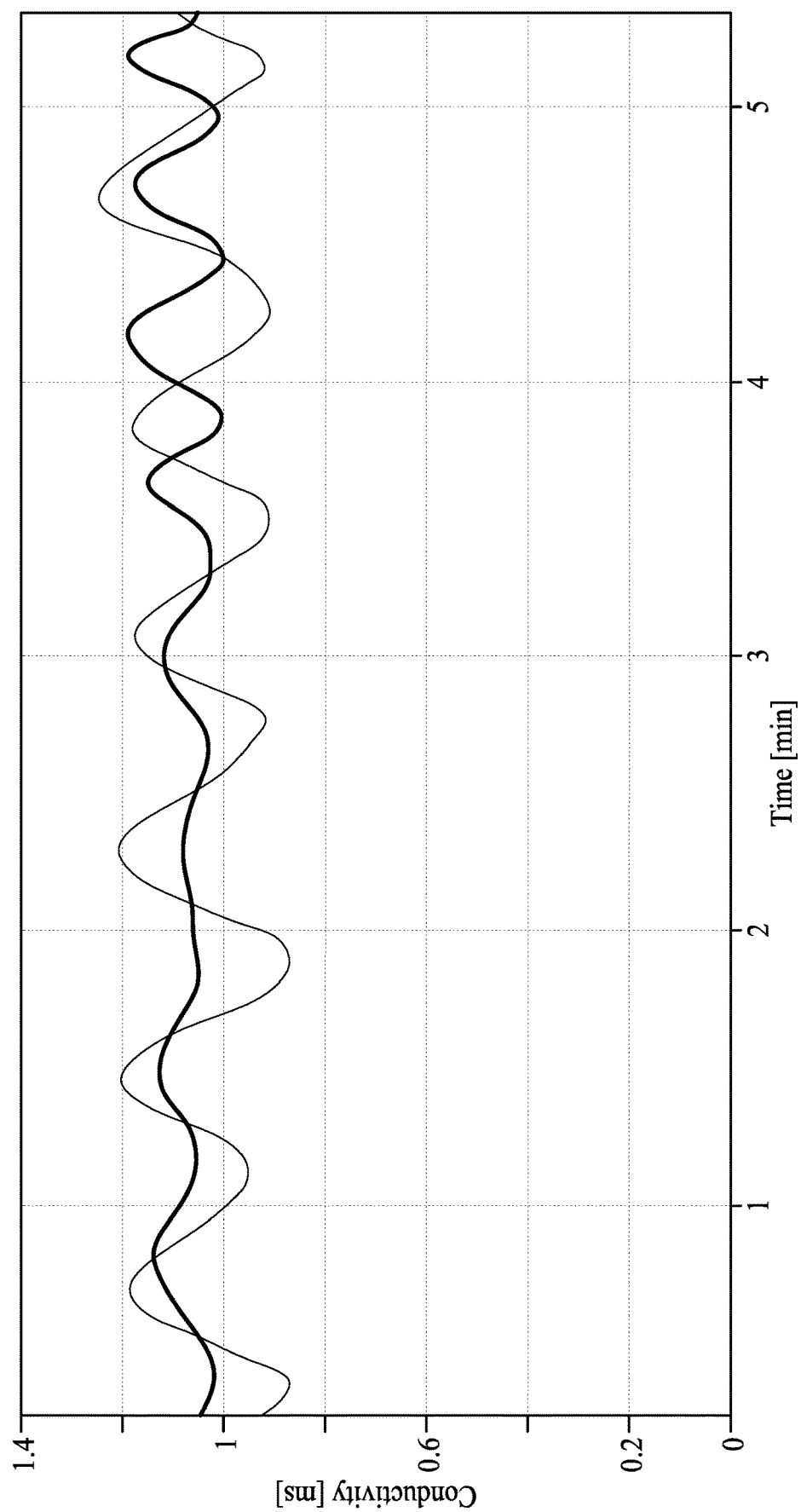
FIG. 8 is a monitoring chart of conductivity of the etchant used in the embodiments.

Referring to FIGS. 7A and 7B, a wet etching is performed to remove portions of the first layer 210 to widen the plurality of openings 212 in operation 106. In some embodiments, the wet etching is performed with an etchant 250, and the etchant 250 can include $H_2O$, $H_2O_2$ and $NH_4OH$. In some embodiments, a ratio of $H_2O$, $H_2O_2$ and $NH_4OH$ can be 5:1:1, but the disclosure is not limited thereto. In some embodiments, the etchant 250 is in contact with a top surface of the first layer 210 and sidewall surfaces of the plurality of openings 212. Further, the etchant 250 oxidizes a top surface of the first layer 210 and sidewall surfaces of the plurality of openings 212 and removes the oxidized materials from the first layer 210 and the openings 212. In some embodiments, the wet etching can be controlled by monitoring conductivity of the etchant 250 during the performing of the wet etching. For example, the conductivity of the etchant 250 is in a range of approximately 800 μS to approximately 1300 μS. In some embodiments, the conductivity of $NH_4OH$ is in a range of approximately 100 μS to approximately 500 μS. The wet etching is ended or terminated when the conductivity of the etchant 250 is outside of the range. In some embodiments, the conductivity of the etchant 250 has a periodic oscillation, as shown in FIG. 8, which is a monitoring chart having the ordinate axis scaled by a conductivity of the etchant 250 and the abscissa axis scaled by time. In some embodiments, the conductivity of the etchant 250 is monitored every minute, as shown in FIG. 8. In some embodiments, the conductivity of the etchant 250 may be measure through different measuring tools, for example, two measuring tools for measuring the conductivity of the etchant 250 are used, as shown in FIG. 8. In other embodiments, the monitoring time period can be adjusted according to different operation requirement. When the conductivity of the etchant 250 is outside of the range, it means the oxidized material removed from the first layer 210 and the openings 212 is of an amount sufficient to alter the conductivity of the etchant 250, or to alter the conductivity of $NH_4OH$ which dominates the removal of the oxidized material, and thus the wet etching can be terminated.

Referring to FIGS. 6A, 6B, 7A and 7B, each of the plurality of openings 212 has the width W1 prior to the performing of the wet etching and has a width W2 after the performing of the wet etching. It should be noted that the width W2 is greater than the width W1. A width difference can be found between the width W1 and the width W2. In some embodiments, the width difference is less than 2 nm, but the disclosure is not limited thereto. In some embodiments, the width difference is less than 1.5 nm, but the disclosure is not limited thereto. In some embodiments, the width difference is between approximately 0.2 nm and approximately 1.5 nm, but the disclosure is not limited thereto.

In some embodiments, the etchant 250 has a lateral etching rate greater than a longitudinal etching rate. The first layer 210 includes a first thickness prior to the performing of the wet etching, and a second thickness after the performing of the wet etching. In some embodiments, the thickness difference is less than the width difference. In some embodiments, the thickness difference between the first thickness and the second thickness is negligible. In some embodiments, when the thickness loss is less than 0.5 nm, the thickness difference between the first thickness and the second thickness may be considered as negligible, but the disclosure is not limited thereto. In some embodiments, when the thickness loss is less than 0.3 nm, the thickness difference between the first thickness and the second thickness may be considered as negligible, but the disclosure is not limited thereto.

According to the method for forming the photomask 10, the global under-size defects are cured by the wet etching, which utilizes the etchant 250 to widen the openings 212 in all the patterns in the die regions 230 to achieve the dummy CD target pattern 232. Further, since the lateral etching rate of the etchant 250 is greater than the longitudinal etching rate, a layer or material for protecting a top surface of the first layer 210 is not required.

Figure 9C:
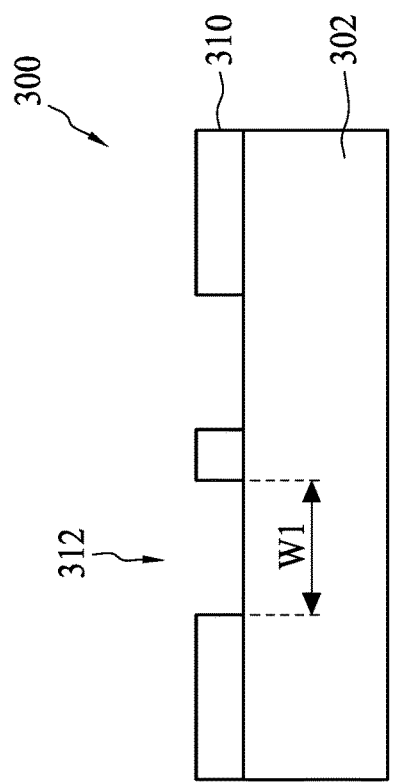
Figure 9B:
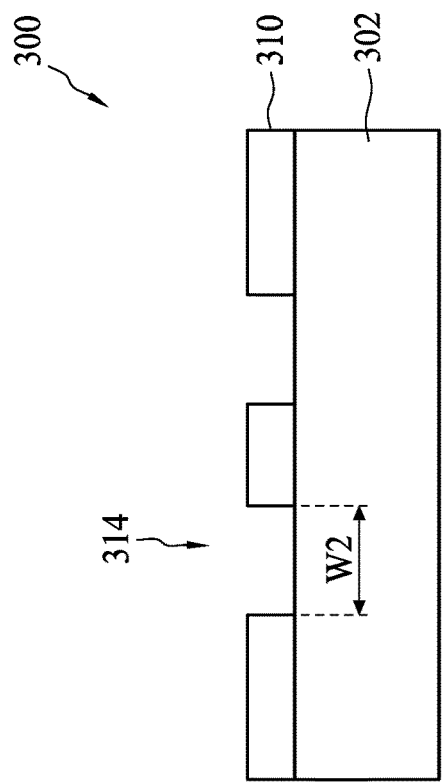
Figure 9A:
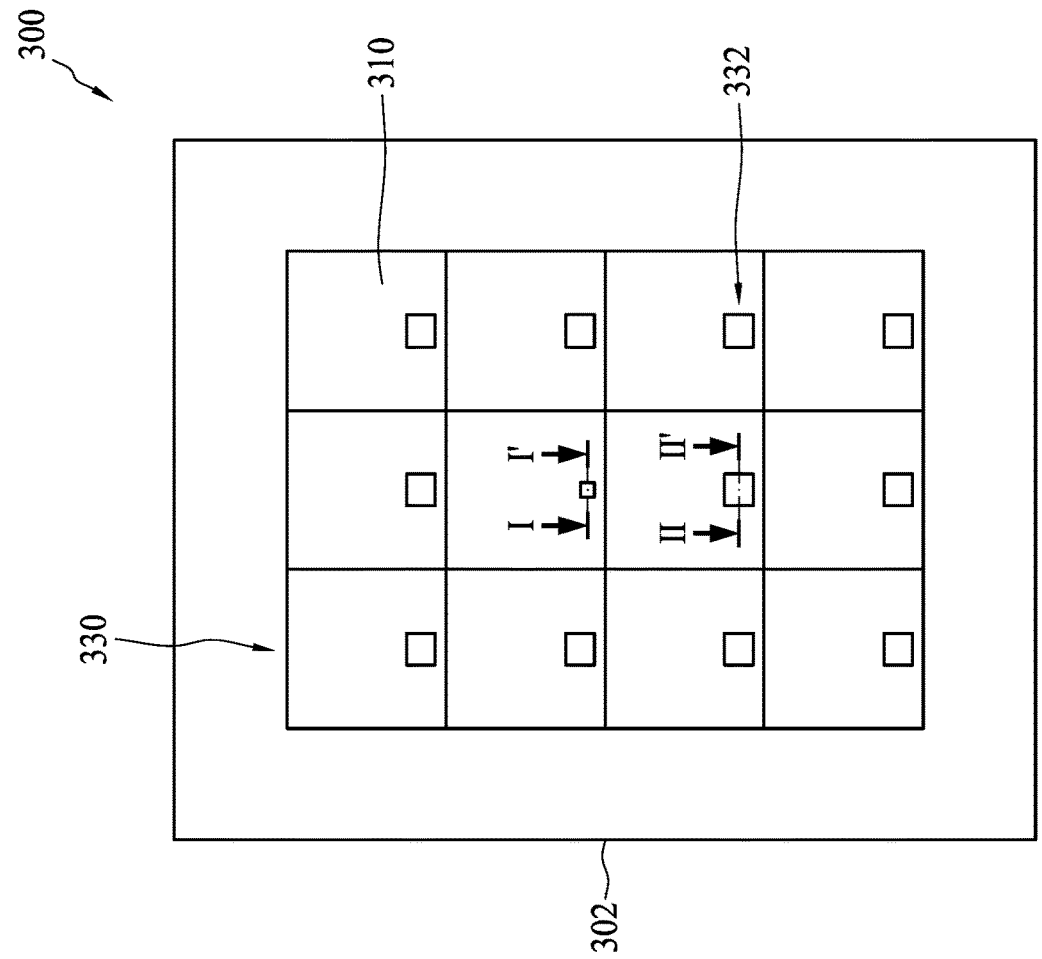

FIGS. 9A, 10A, 11A and 12A are top views illustrating a photomask 300 at various fabrication stages constructed according to aspects of the present disclosure in one or more embodiments. FIGS. 9B, 10B, 11B and 12B are partially enlarged cross-sectional views taken along line I-I' of FIGS. 9A, 10A, 11A and 12A, respectively, and FIGS. 9C, 10C, 11C and 12C are partially enlarged cross-sectional views taken along line II-II' of FIGS. 9A, 10A, 11A and 12A, respectively. Similar elements in FIGS. 4A to 7B and FIGS. 9A to 12C can include similar materials; therefore, descriptions of such redundant details are omitted in the interest of brevity. As shown in FIGS. 9A to 9C, a substrate 302 is received or provided in operation 110. In some embodiments, the substrate 302 is a mask substrate that includes low thermal expansion material (LTEM) serving to minimize image distortion due to mask heating induced by intensified illumination radiation.

Still referring to FIGS. 9A to 9C, a first layer 310, such as a shielding layer 310 is formed over the mask substrate 302 in operation 110. In some embodiments, the first layer 310 can be a single-layer structure. In other embodiments, the first layer 310 can be a multi-layer structure, but the disclosure is not limited thereto. In some embodiments, a hard mask layer (not shown) can be formed on the first layer 310. A patterned second layer (not shown) such as a patterned photoresist can be formed on the first layer 310 in operation 110, and the patterned second layer defines patterns for one die region or several die regions 330. In some embodiments, dummy patterns can be formed in the patterned second layer. For example, a dummy CD target pattern 332 is formed in each of the die regions 330. As mentioned above, the dummy CD target pattern 332 helps to analyze CD mean value and check CD uniformity. In some embodiments, a length of the dummy CD target pattern 332 is between approximately 1 μm and 5 μm, but the disclosure is not limited thereto.

Still referring to FIGS. 9A to 9C, the patterns are transferred from the patterned second layer to the first layer 310. The transferring of the patterns can be similar to those described above, and the repetitive details are omitted herein for brevity. Accordingly, the first layer 310 is patterned to have a plurality of openings in operation 110. In other words, the patterned first layer 310 inherits the patterns for one die region or several die regions 330 from the patterned second layer 320, and also inherits the dummy target CD pattern 332, as shown in FIGS. 9A to 9C. After the forming of the openings, an AEI can be performed and a clean operation can be subsequently performed.

Next, the patterned second layer is removed or stripped. In some embodiments, an ASI is performed after the removing of the patterned second layer. In some embodiments, an SEM system is utilized to provide an AEI image that reveals the dimensions of the patterns formed in the first layer 310. In some embodiments, an AEI image that reveals the dimensions of each of the dummy CD target patterns 332 is provided. As mentioned above, the dummy CD target pattern 332 helps to analyze CD mean value and CD uniformity. In some embodiments, the dummy target CD pattern 332 serves as a representation of the circuit pattern in the die region 330. In some embodiments, it is found that the CD uniformity may not be as expected. For example, in some embodiments, in some of the dummy target CD patterns 332, the opening 312 has a first width W1, while in other of the dummy target CD patterns 332, the opening 314 has a second width W2 less than the first width W1. In some embodiments, the opening has the first width W1, which meets a target value, such as the CD requirement, and which is defined as a first opening 312, while a second opening 314 has the second width W2, which is less than the CD requirement. Further, since the second width W2 of the second opening 314 is less than the target value, an undersize defect is recognized. In other words, a substrate 302 having a first opening 312 and a second opening 314 formed thereon is received in operation 110. Since the first opening 312 has the first width W1, which meets the target value, and the second opening 314 has a second width W2 less than the first width W1, a local under-size defect is found in the dummy target CD pattern 332, and thus a repair is required.

Referring to FIGS. 10A to 10C, a protecting layer 340 is disposed over the substrate 302 in operation 112. Further, in operation 112, the protecting layer 340 can be patterned such that it covers the die region having the first openings 312 and exposes the die region having the second opening 314, as shown in FIGS. 10B and 10C. In some embodiments, the protecting layer 340 can include a photoresist layer, but the disclosure is not limited thereto.

Referring to FIGS. 11A to 11C, a wet etching is performed to widen the second opening 314 in operation 114. In some embodiments, the wet etching is performed with an etchant 350, and the etchant 350 can include $H_2O$, $H_2O_2$ and $NH_4OH$. In some embodiments, a ratio of $H_2O$, $H_2O_2$ and $NH_4OH$ can be 5:1:1, but the disclosure is not limited thereto. In some embodiments, the etchant 350 is in contact with a top surface of the first layer 310 in the die region exposed through the protecting layer 340 and sidewall surfaces of the second opening 314. As mentioned above, the etchant 340 oxidizes a top surface of the first layer 310 in the die region exposed through the protecting layer 340 and sidewall surfaces of the second opening 314, and removes the oxidized materials from the first layer 310 and the second opening 314. In some embodiments, the wet etching can be controlled by monitoring conductivity of the etchant 350 during the performing of the wet etching. For example, the conductivity of the etchant 350 is in a range of approximately 800 µS to approximately 1300 µS. In some embodiments, the conductivity of the $NH_4OH$ is in a range of approximately 100 µS to approximately 500 µS. The wet etching is terminated when the conductivity of the etchant 350 is outside of the range. In some embodiments, the conductivity of the etchant 350 has a periodic oscillation, as shown in FIG. 8. When the conductivity of the etchant 350 is outside of the range, it means the oxidized material removed from the first layer 310 and the second opening 314 is of an amount sufficient to alter the conductivity of the etchant 350, or to alter the conductivity of $NH_4OH$, which dominates the removal of the oxidized material, and thus the wet etching can be terminated.

Figure 12C:
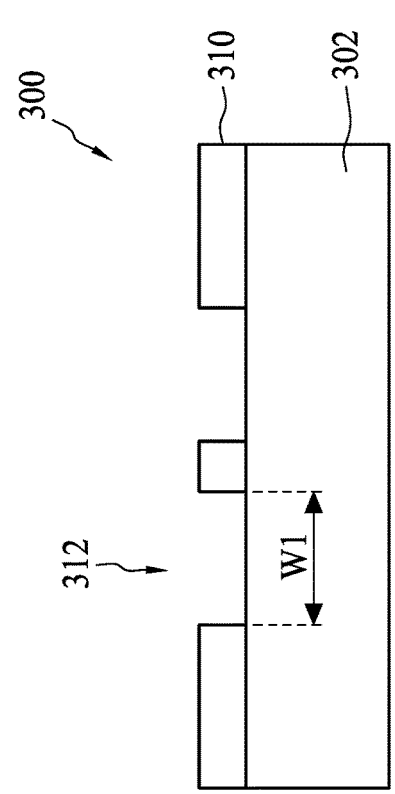
Figure 12B:
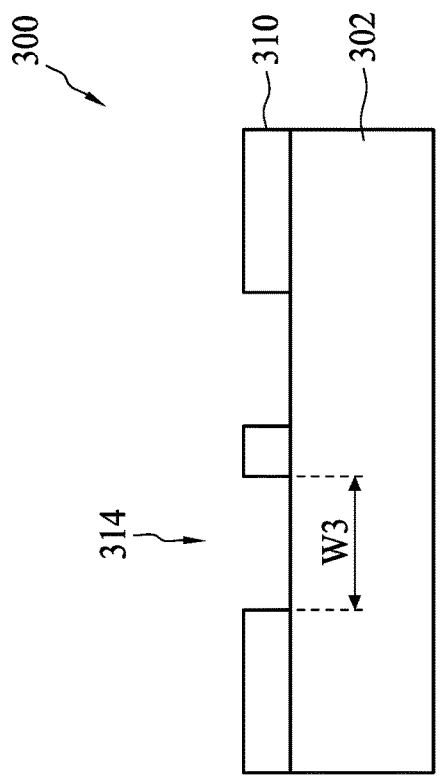
Figure 12A:
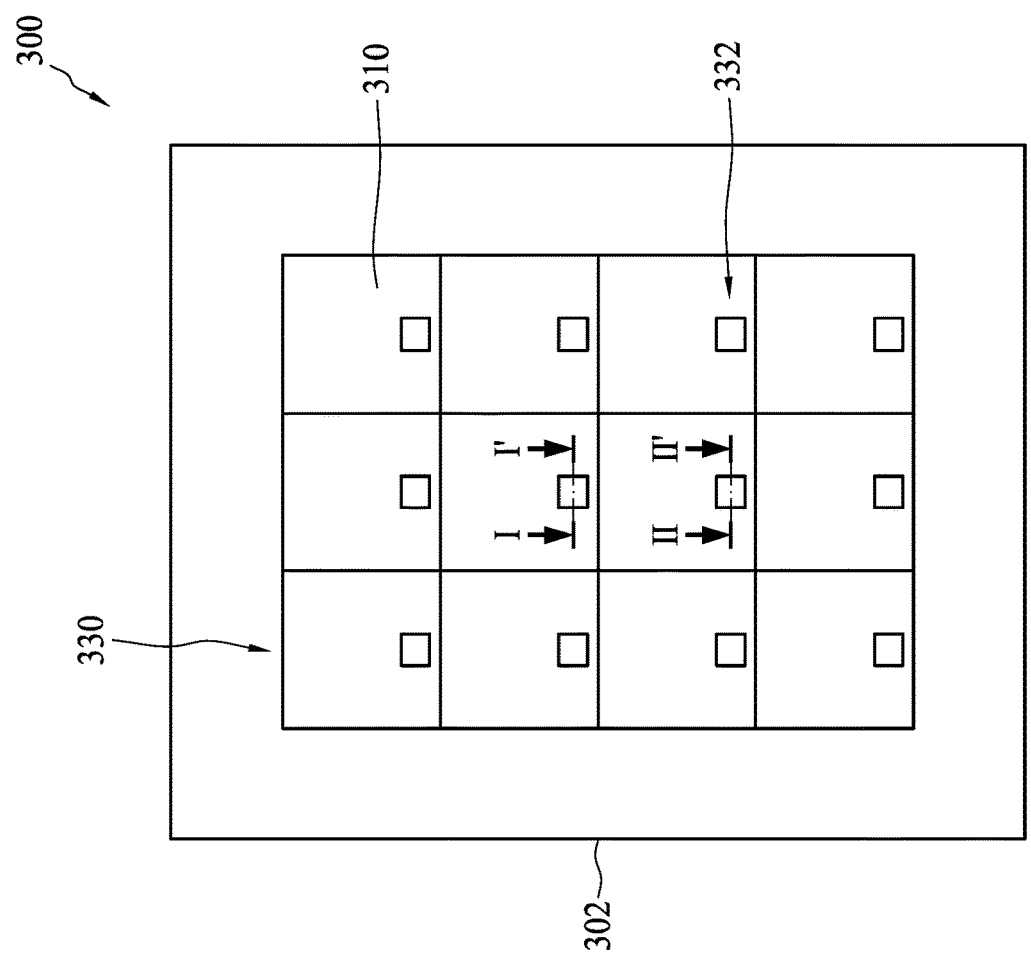

Referring to FIGS. 12A to 12C, after the performing of the wet etching, the protecting layer 340 is removed or stripped. Comparing FIG. 9B and FIG. 12B, the second opening 314 has the second width W2 prior to the performing of the wet etching (as shown in FIG. 9B) and a third width W3 after the performing of the wet etching (as shown in FIG. 12B). It should be noted that the third width W3 is greater than the second width W2. Further, the third width W3 of the second opening 314 after the performing of the wet etching is similar to the first width W1 of the first openings 312. A width difference can be found between the second width W2 and the third width W3. In some embodiments, the width difference is less than 2 nm, but the disclosure is not limited thereto. In some embodiments, the width difference is less than 1.5 nm, but the disclosure is not limited thereto. In some embodiments, the width difference is between approximately 0.2 nm and approximately 1.5 nm, but the disclosure is not limited thereto.

As mentioned above, the etchant 350 has a lateral etching rate greater than a longitudinal etching rate. The first layer 310 includes a first thickness prior to the performing of the wet etching, and a second thickness after the performing of the wet etching. In some embodiments, the thickness difference is less than the width difference. In some embodiments, the thickness difference between the first thickness and the second thickness is negligible.

According to the method for forming the photomask 11, the local under-size defects are cured by the wet etching, which utilizes the etchant 350 not only to widen the second opening 314 in the dummy CD target pattern 332, but also to widen the second opening 312 in the die region 330. Accordingly, CD uniformity is improved, and all openings 312 and 314 meet the CD requirement.

Figure 13C:
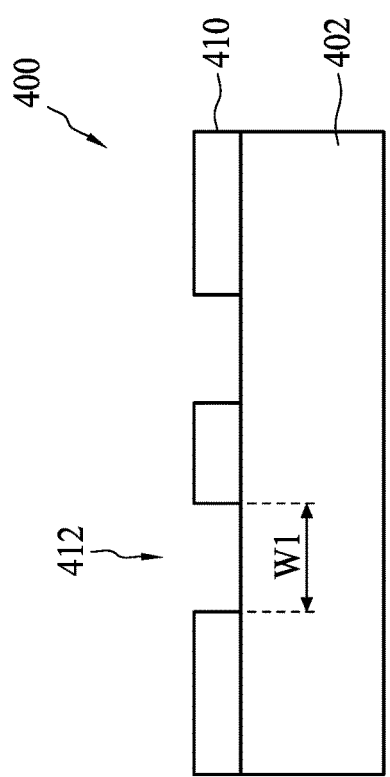
Figure 13B:
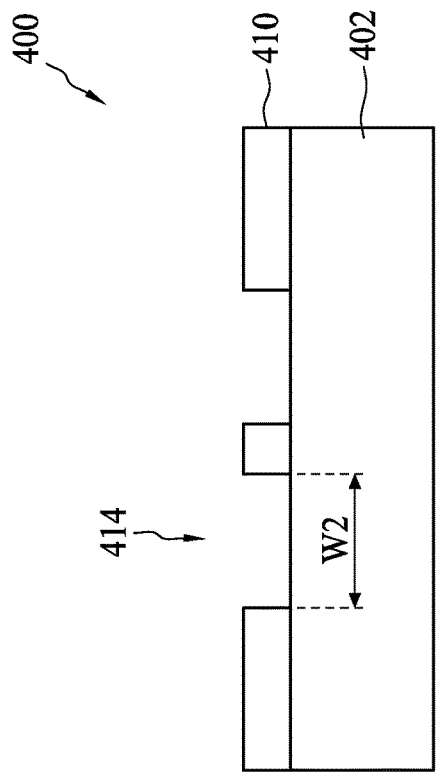
Figure 13A:
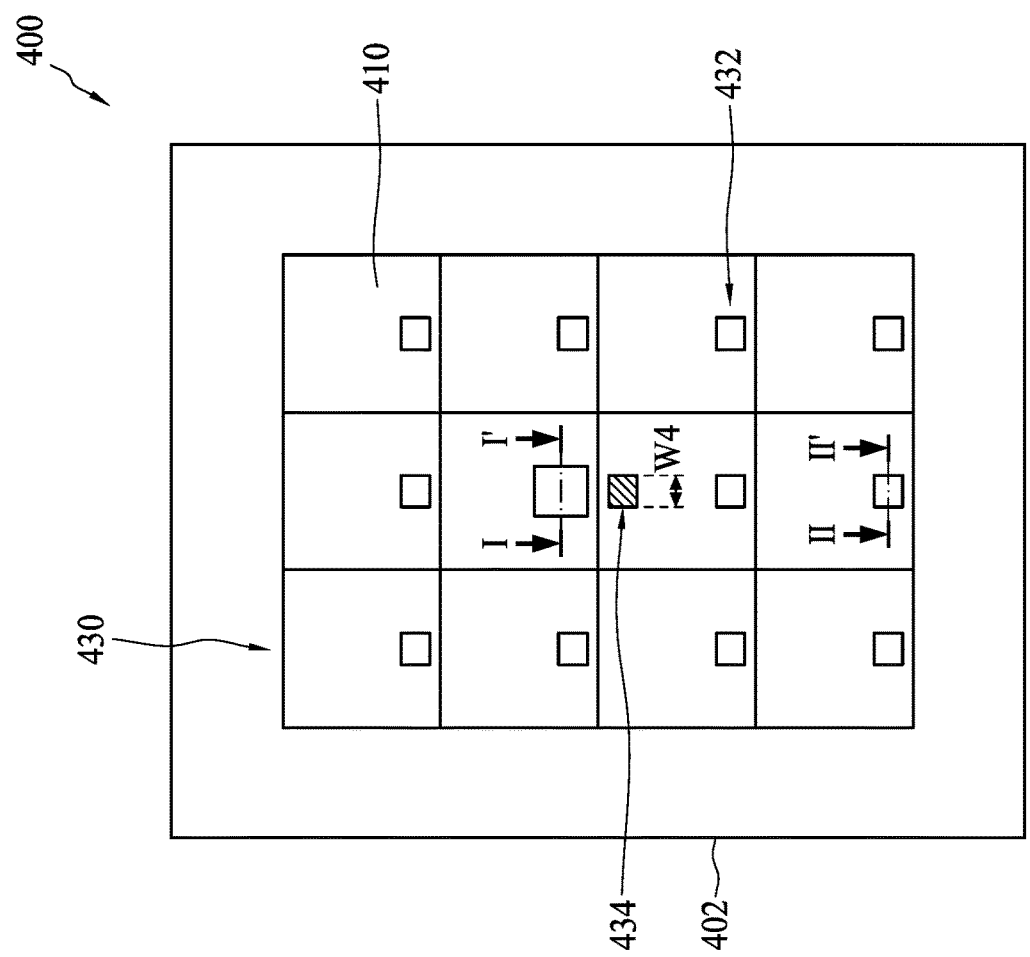

FIGS. 13A, 14A, 15A and 16A are top views illustrating a photomask 400 at various fabrication stages constructed according to aspects of the present disclosure in one or more embodiments. FIGS. 13B, 14B, 15B and 16B are partially enlarged cross-sectional views taken along line I-I' of FIGS. 13A, 14A, 15A and 16A, respectively, and FIGS. 13C, 14C, 15C and 16C are partially enlarged cross-sectional views taken along line II-II' of FIGS. 13A, 14A, 15A and 16A, respectively. Similar elements in FIGS. 4A to 7B and FIGS. 13A to 16C can include similar materials; therefore, descriptions of such redundant details are omitted in the interest of brevity. As shown in FIGS. 13A to 13C, a substrate 402 is received or provided in operation 120.

A first layer 410, such as a shielding layer 410 is formed over the mask substrate 402 in operation 120. In some embodiments, the first layer 410 can be a single-layer structure. In other embodiments, the first layer 410 can be a multi-layer structure, but the disclosure is not limited thereto. In some embodiments, a hard mask layer (not shown) can be formed on the first layer 410. A patterned second layer (not shown) such as a patterned photoresist can be formed on the first layer 410 in operation 120, and the patterned second layer defines patterns for one die region or several die regions 430. In some embodiments, dummy patterns can be formed in the patterned second layer. For example, a dummy CD target pattern 432 is formed in each of the die regions 430. As mentioned above, the dummy CD target pattern 432 helps to analyze CD mean value and check CD uniformity. In some embodiments, a length of the dummy CD target pattern 432 is between approximately 1 µm and 5 µm, but the disclosure is not limited thereto.

In some embodiments, an adjustment mark 434 can be disposed in at least one die region 430 in operation 122, as shown in FIG. 13A. In some embodiments, operation 122 and operation 120 can be performed simultaneously. The adjustment mark 434 can be an optimum exposure (EOP) mark. It should be known that in the semiconductor manufacturing process, many photomasks are used to form different patterns in the wafer, the semiconductor layers, the dielectric layer, and the conductive layers. Such photomasks have variably sized openings surrounded by large, opaque areas. Inconsistencies in CDs between large and small openings in the resist layers have different exposure energy requirements. For example, the optimal energy dose setting for a large opening is much less than the optimal energy setting for a smaller opening. Therefore, energy adjustment is an important factor in the exposure operation in the semiconductor manufacturing process. The adjustment mark 434 (i.e., the EOP mark) serves to provide such information to the exposure tool. By observing the opening size or feature size in the adjustment mark 434, the exposure energy dose is adjusted to meet the requirement. Additionally, although the adjustment mark 434 as shown in FIGS. 13A, 14A, 15A and 16A is omitted from the abovementioned embodiments, it should be easily realized to utilize this adjustment mark in the die region(s) in the abovementioned embodiments.

Still referring to FIGS. 13A to 13C, the patterns are transferred from the patterned second layer to the first layer 410. The transferring of the patterns can be similar to those described above, and therefore the repetitive details are omitted herein for brevity. Accordingly, the first layer 410 is patterned to have a plurality of openings in operation 120. In other words, the patterned first layer 410 inherits the patterns for one die region or several die regions 430 transferred from the patterned second layer 420, and also inherits the dummy target CD pattern 432 and adjustment mark 434, as shown in FIGS. 13A to 13C. After the forming of the openings, an AEI can be performed and a clean operation can be subsequently performed.

Next, the patterned second layer is removed or stripped. In some embodiments, an ASI is performed after the removing of the patterned second layer. In some embodiments, an SEM system is utilized to provide an AEI image that reveals the dimensions of the patterns formed in the first layer 410. In some embodiments, an AEI image that reveals the dimensions of each of the dummy CD target pattern 432 is provided. As mentioned above, the dummy CD target pattern 432 helps to analyze CD mean value and CD uniformity. In some embodiments, the dummy target CD pattern 432 serves as a representation of the circuit pattern in the die region 430. In some embodiments, it is found that the CD uniformity may not be as expected. For example, in some embodiments, in some of the dummy target CD patterns 432, the opening has a first width W1, while in other of the dummy target CD patterns 432, the opening has a second width W2 greater than the first width W1. In some embodiments, the opening has the first width W1, which meets a target value, such as the CD requirement, and which is defined as a first opening 412, while the second opening 414 has the second width W2, which is greater than the target value. Further, since the second width W2 of the second opening 414 is greater than a target value, an over-size defect is recognized. In other words, a substrate 402 having a first opening 412 and a second opening 414 formed thereon is received in operation 120. Since the first opening 412 has the first width W1, which meet the target value, and the second opening 414 has the second width W2 greater than the first width W1, a local over-size defect is found in the dummy target CD pattern 432. In some embodiments, a width difference between the first width W1 of the first opening 412 and the second width W2 of the second opening 414 is calculated. When the width difference is equal to or less than a predetermined value, a repair is required. In some embodiments, when the width difference is greater than the predetermined value, the photomask is reported to fail and the photomask will be scrapped. In some embodiments, the predetermined value is 2 nm, but the disclosure is not limited thereto Referring to FIGS. 14A to 14C, a protecting layer 440 is disposed over the substrate 402 in operation 124. Further, in operation 124, the protecting layer 440 can be patterned such that it covers the die region 430 having the second opening 414 and exposes the die region 430 having the first openings 412, as shown in FIGS. 14B and 14C. In some embodiments, the protecting layer 440 can include a photoresist layer, but the disclosure is not limited thereto.

Referring to FIGS. 15A to 15C, a wet etching is performed to widen the first openings 412 in operation 126. In some embodiments, the wet etching is performed with an etchant 350, and the etchant 350 can include $H_2O$, $H_2O_2$ and $NH_4OH$. In some embodiments, a ratio of $H_2O$, $H_2O_2$ and $NH_4OH$ can be 5:1:1, but the disclosure is not limited thereto. In some embodiments, the etchant 450 is in contact with a top surface of the first layer 410 in the die region exposed through the protecting layer 440 and sidewall surfaces of the first openings 412. As mentioned above, the etchant 450 oxidizes a top surface of the first layer 110 in the die region exposed through the protecting layer 440 and sidewall surfaces of the first openings 412, and removes the oxidized materials from the first layer 410 and the first openings 412. In some embodiments, the wet etching can be controlled by monitoring conductivity of the etchant 450 during the performing of the wet etching. For example, the conductivity of the etchant 450 is in a range of approximately 800 µS to approximately 1300 µS. In some embodiments, the conductivity of $NH_4OH$ is in a range of approximately 100 µS to approximately 500 µS. The wet etching is terminated when the conductivity of the etchant 450 is outside of the range. In some embodiments, the conductivity of the etchant 450 has a periodic oscillation, as shown in FIG. 8. When the conductivity of the etchant 450 is outside of the range, it means the oxidized material removed from the first layer 410 and the first openings 412 is of an amount sufficient to alter the conductivity of the etchant 450, or to alter the conductivity of $NH_4OH$, which dominates the removal of the oxidized material, and thus the wet etching can be terminated.

Figure 16B:
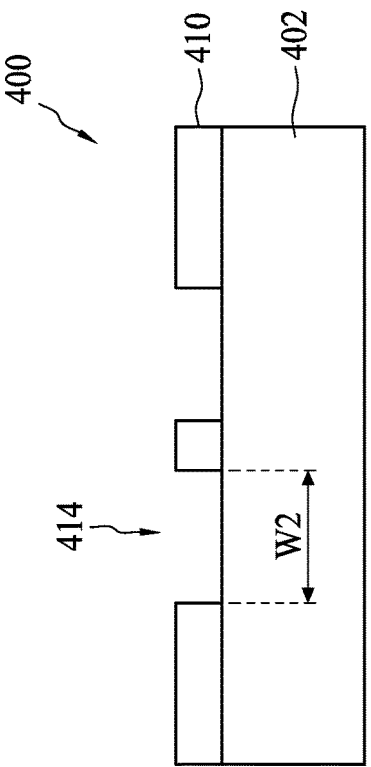
Figure 16C:
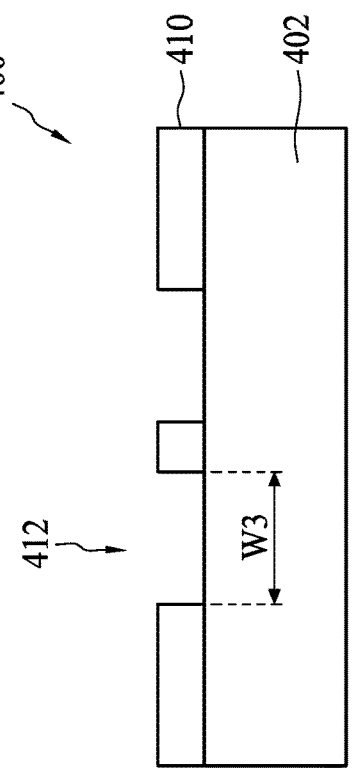
Figure 16A:
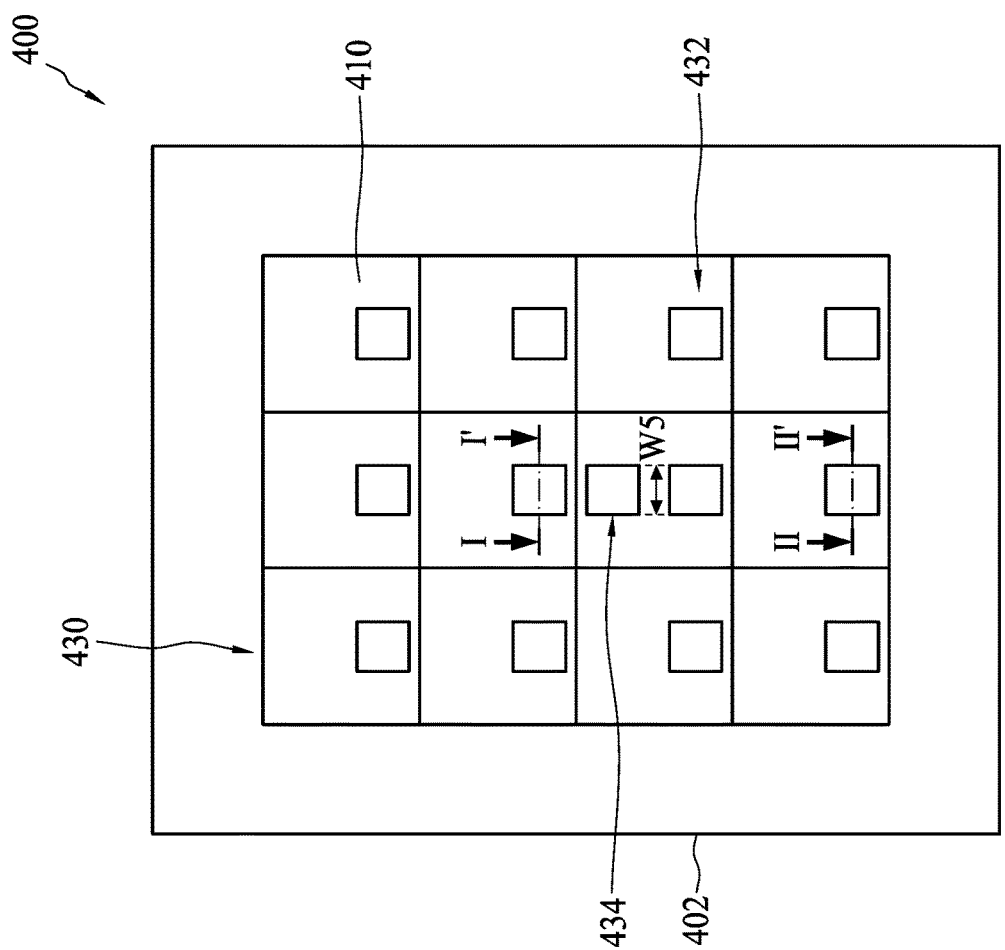

Referring to FIGS. 16A to 16C, after the performing of the wet etching, the protecting layer 440 is removed or stripped. Comparing FIG. 13B and FIG. 16B, the first opening 412 has the first width W1 prior to the performing of the wet etching (as shown in FIG. 13B) and a third width W3 after the performing of the wet etching (as shown in FIG. 16B). It should be noted that the third width W3 is greater than the second width W2. Further, the third width W3 of the first openings 412 after the performing of the wet etching is similar to the second width W1 of the second opening 414. A width difference can be found between the second width W2 and the third width W3. In some embodiments, the width difference is less than 2 nm, but the disclosure is not limited thereto. In some embodiments, the width difference is less than 1.5 nm, but the disclosure is not limited thereto. In some embodiments, the width difference is between approximately 0.2 nm and approximately 1.5 nm, but the disclosure is not limited thereto.

Still referring to FIG. 13A and FIG. 16A, the adjustment mark 434 may have a fourth width W4 prior to the performing of the wet etching (as shown in FIG. 13A) and a fifth width W5 after the performing of the wet etching (as shown in FIG. 16A). Since the adjustment mark 434 is located in the die region 430 that is exposed through the protecting layer 440, the openings or patterns in the adjustment mark 434 are widened in the wet etching. Accordingly, the fifth width W5 is greater than the fourth width W4.

As mentioned above, the etchant 450 has a lateral etching rate greater than a longitudinal etching rate. The first layer 410 includes a first thickness prior to the performing of the wet etching, and a second thickness after the performing of the wet etching. In some embodiments, the thickness difference is less than the width difference. In some embodiments, the thickness difference between the first thickness and the second thickness is negligible.

According to the semiconductor manufacturing method 12, the local over-size defects are cured by the wet etching, which utilizes the etchant 450 not only to widen the first openings 412 in the dummy CD target pattern 432, but also to widen the first openings 412 in all the patterns in the die regions 430 free of the local over-size defects. Accordingly, all the first openings 412 and the second openings 414 have the same width. In other words, although the CD of the patterns in the photomask 400 are greater than the target value, CD uniformity is improved.

A photolithography is performed to transfer the patterns including the first openings 412 and the second openings 414 in the die regions 430 to a layer in operation 128. In some embodiments, a layer 602 may be formed on a substrate 600. The patterns including the first openings 412 and the second openings 414 may be transferred to the layer 602. During the photolithography, a photoresist 604 is formed on the layer 602 by, for example but not limited thereto, a spin-on coating operation. A soft bake operation, such as a baking at a high temperature or an applying of a chemical such as hexamethyldisilizane (HMDS), is performed to enhance an adhesion of the photoresist 604 to the substrate 600 or the layer 602. An exposure is performed for exposing the photoresist layer 604 by an exposure tool to form a latent image pattern on the photoresist layer 604. A developing operation is performed to form a patterned photoresist layer 604 on the substrate 600 or the layer 602. A post expose bake (PEB), a post develop bake (PDB), or both can be performed. The patterns including the first openings 412 and the second openings 414 in the die region 430 are then transferred from the patterned photoresist layer 604 to the substrate 600 or the layer 602 by, for example but not limited thereto, an etching operation, in operation 128.

Figure 17:
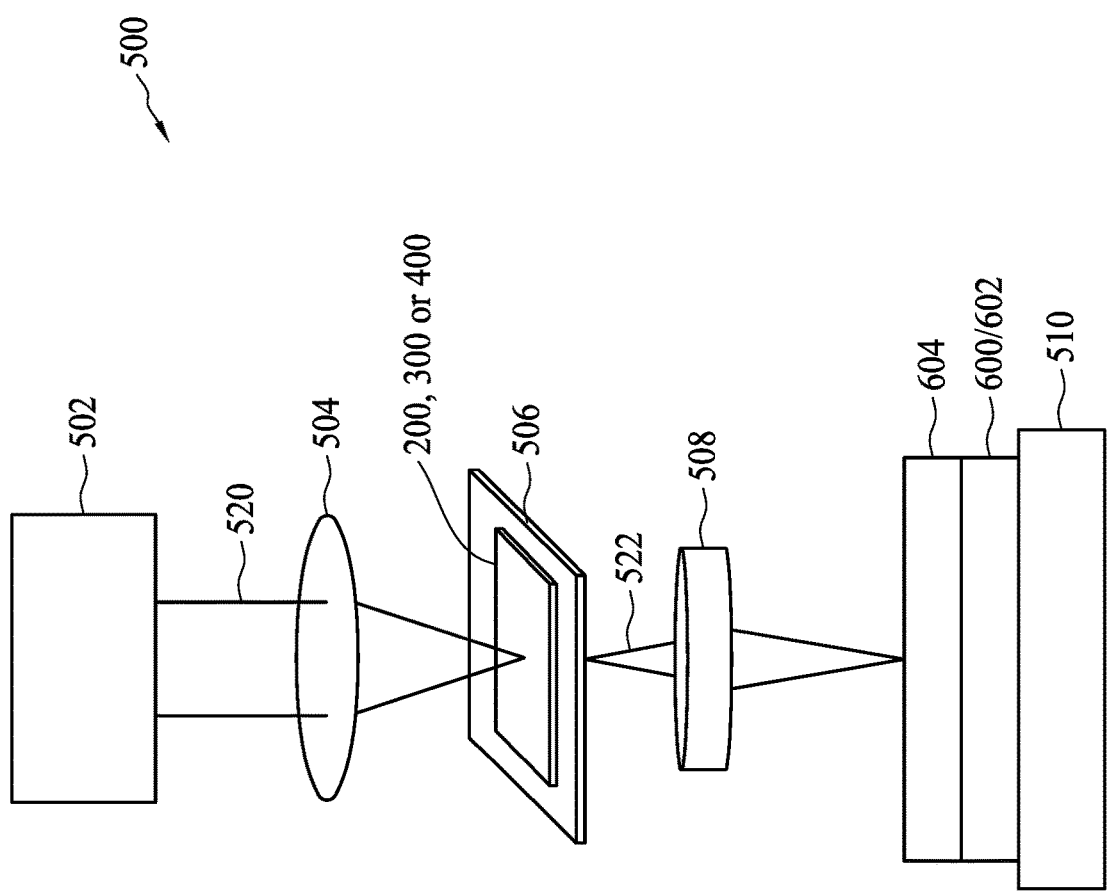
FIG. 17 is a schematic drawing illustrating an exposure tool for implementing one or more embodiments of the present disclosure.

Referring to FIG. 17, an exposure tool 500 is an example of a tool that can provide benefit to one or more embodiments of the present disclosure. The exposure tool 500 may include a light source 502, a condense lens 504, a mask stage 506, a projection lens 508, and a substrate stage 510. The photomask 200, 300 or 400 is positioned on the mask stage 506, and the substrate 600 having the layer 602 and the photoresist 604 are positioned on the substrate stage 510. However, other configurations and inclusion or omission of the device may be possible. In the present disclosure, the tool 500 is also referred as a stepper or a scanner, and the photomask 200, 300 or 400 is also referred to as a mask, a photo mask, or a reticle. In the present embodiment, the light source 502 includes a radiation source providing the light 520 having a wavelength range from UV to DUV. For example, a mercury lamp provides UV wavelength, such as G-line (436 nm) or I-line (365 nm), or an excimer laser provides DUV wavelength, such as 248 nm, 193 nm, or 157 nm. The condense lens 504 is configured to guide the light 520 to the photomask 200, 300 or 400. The photomask 200, 300 or 400 blocks a portion of the light 520 and provides an aerial image of the light 520 to form the patterned light 522. The photo mask 200, 300 or 400 is positioned on the mask stage 506. The mask stage 506 includes a plurality of motors, roller guides, and tables; secures the photomask 200, 300 or 400 on the mask stage 506 by vacuum; and provides accurate position and movement of the photomask 200, 300 or 400 in X, Y, and Z directions during alignment, focus, leveling and exposure operations with the optical lithography tool 500. The projection lens 508 includes a magnification lens for reducing the pattern image provided by the photomask 200, 300 or 400, and guides the patterned light 522 to the photoresist layer 604 deposited on the layer 602 secured by the substrate stage 510. The substrate stage 510 includes motors, roller guides, and tables; secures the substrate 600 by vacuum; and provides accurate position and movement of the substrate 600 in X, Y, and Z directions during alignment, focus, leveling and exposure operations in the exposure tool 500 so that the patterns on the photomask 200, 300 or 400 are transferred onto the substrate 600 or the layer 602 in a repetitive fashion (though other lithography methods are possible). The tool 500, or portions thereof, may include additional items, such as a vacuum system and/or a cooling system.

As mentioned above, energy adjustment is an important factor in the exposure operation in the semiconductor manufacturing process. The adjustment mark 434 (i.e., the EOP mark) serves to provide such information to the exposure tool. By observing the opening size or pattern size in the adjustment mark 434, the exposure energy dose of the light 520 is adjusted to meet the requirement. In other words, an optimum exposure dose amount (Eop) in the photolithography is determined by the adjustment mark 434. In some embodiments, the optimum exposure dose amount in the exposure is between approximately 8 mJ/cm$^2$ and approximately 72 mJ/cm$^2$, but the disclosure is not limited thereto. In some embodiments, the optimum exposure dose amount in the exposure is between approximately 10 mJ/cm$^2$ and approximately 60 mJ/cm$^2$, but the disclosure is not limited thereto. In some embodiments, an adjustment to the exposure dose amount may not exceed 20%.

Figure 18:
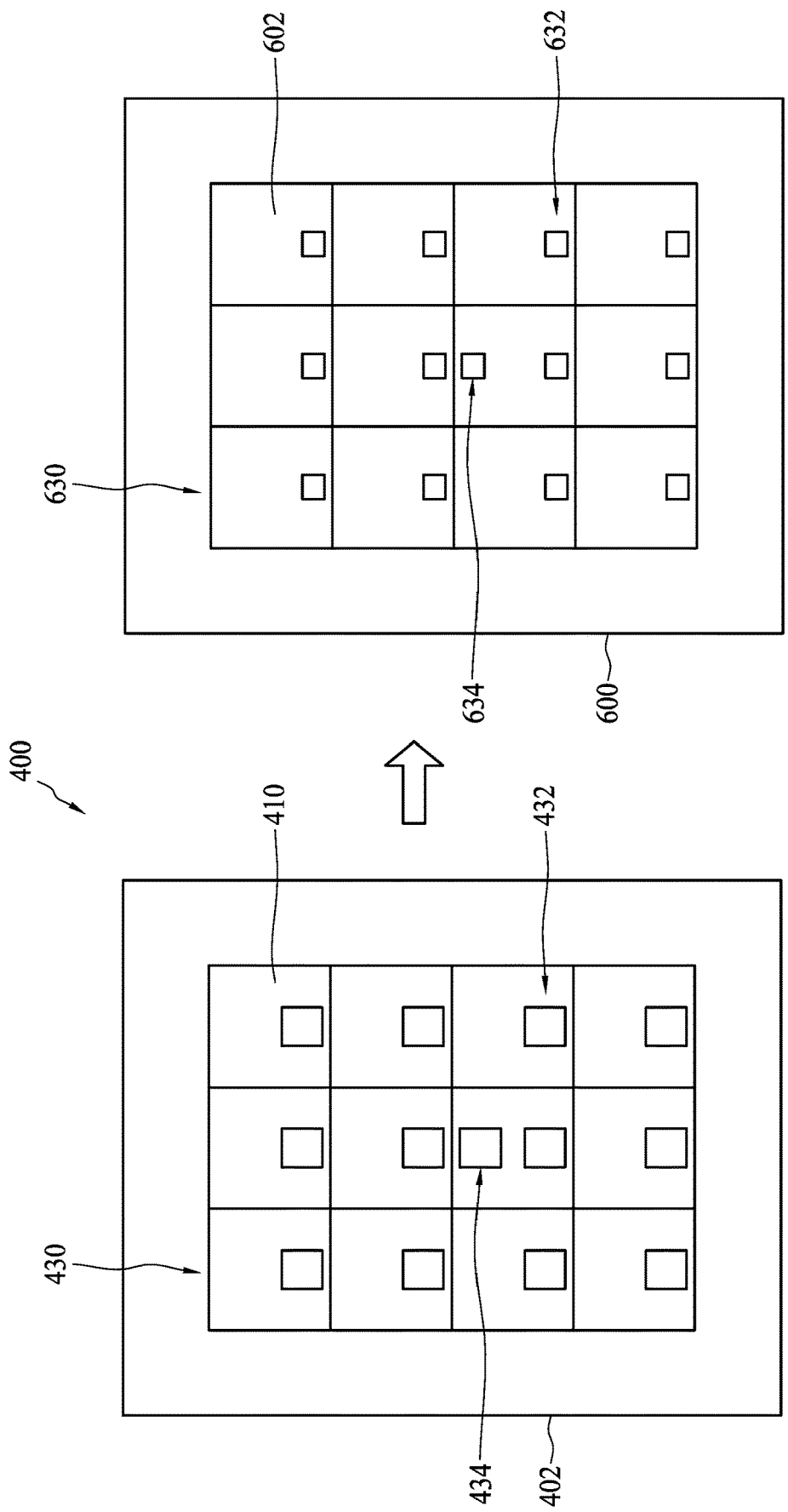
FIG. 18 is a schematic drawing illustrating a pattern transfer according to aspects of the present disclosure in one or more embodiments.

Referring to FIG. 18, by adjusting the exposure dose amount in the exposure tool 500, the patterns having the CD greater than the target value are reduced during the transferring. Accordingly, the pattern formed in the layer 602 can help the CD meet the target value, as shown in FIG. 18. Accordingly, the patterned layer 602 includes circuit patterns disposed in each of the die regions 630, the dummy CD target patterns 632 disposed in each of the die regions 630, and the adjustment mark 634. The dimensions of the circuit patterns, the dummy CD target pattern 632 and the adjustment mark 634 in the layer 602 are all less than the dimension of the photomask 400.

According to the semiconductor manufacturing method 12, the CD uniformity is improved, even though CD is greater than the target value. However, by adjusting the exposure dose amount according to the adjustment mark 434, the patterns can be reduced during the performing of the photolithography, and thus the patterns formed on the target layer still meet the CD requirement.

The present disclosure therefore provides methods for forming a photomask and a semiconductor manufacturing method. In some embodiments, a wet etching is used to cure global under-size defects. In some embodiments, a wet etching and a protecting layer 340 are provided to cure local under-size defects. In some embodiments, a wet etching and a protecting layer 440 are provided to improve pattern uniformity. Further, an adjustment mark is added so that an exposure energy dose can be adjusted according to the adjustment mark, and patterns transferred to the target layer can have a pattern size that meets the CD requirements. Thus, local over-sized defect is cured.

The present disclosure provides a method for forming a photomask. The method includes the following operations. A substrate is received. The substrate includes a first layer formed thereon. A patterned second layer exposing portions of the first layer is formed over the substrate. The exposed portions of the first layer are removed through the patterned second layer to form a plurality of openings in the first layer. The patterned second layer is removed. A wet etching is performed to remove portions of the first layer and to widen the plurality of openings with an etchant. In some embodiments, the etchant is in contact with a top surface of the first layer and sidewalls of the plurality of openings. In some embodiments, each of the plurality of openings has a first width prior to the performing of the wet etching and a second width after the performing of the wet etching. The second width is greater than the first width.

In some embodiments, a method for forming a photomask is provided. The method includes the following operations. A substrate is received. The substrate has a first opening and a second opening formed thereon. In some embodiments, the first opening has a first width and the second opening has a second width less than the first width. A protecting layer is formed to cover the first opening and expose the second opening. A wet etching is performed to widen the second opening with an etchant. In some embodiments, the second opening has a third width after the performing of the wet etching, and the third width of the second opening is similar to the first width of the first opening.

In some embodiments, a semiconductor manufacturing method is provided. The method includes the following operations. A substrate is received. A photolithography is performed to transfer a first pattern from a photomask to the substrate to form a second pattern. In some embodiments, the first pattern has a first dimension, and the second pattern has a second dimension less than the first dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photomask, comprising:
    receiving a substrate comprising a first layer formed thereon, wherein a patterned second layer exposing portions of the first layer is disposed over the substrate;
    removing the exposed portions of the first layer through the patterned second layer to form a plurality of openings in the first layer;
    removing the patterned second layer; and
    performing a wet etching to remove portions of the first layer with an etchant,
    wherein the etchant is in contact with a top surface of the first layer and sidewalls of the plurality of openings, each of the plurality of openings has a first width prior to the performing of the wet etching and a second width after the performing of the wet etching, and the second width is greater than the first width.

2. The method of claim 1, wherein the etchant comprises $H_2O_2$ and $NH_4OH$.

3. The method of claim 1, further comprising monitoring a conductivity of the etchant during the performing of the wet etching, and ending the wet etching when the conductivity of the etchant is outside of a range.

4. The method of claim 3, wherein the range is between approximately 800 µS and 1300 µS.

5. The method of claim 1, wherein the first layer includes a first thickness prior to the performing of the wet etching, a second thickness after the performing of the wet etching, and a thickness difference between the first thickness and the second thickness, the plurality of openings has a width difference between the first width and the second width, and the thickness difference is less than the width difference.

6. The method of claim 5, wherein the width difference is less than 2 nanometers.

7. A method for forming a photomask, comprising:
    receiving a substrate having a first opening and a second opening formed thereon, wherein the first opening has a first width, and the second opening has a second width less than the first width;
    forming a protecting layer to cover the first opening and expose the second opening; and
    performing a wet etching to widen the second opening with an etchant,
    wherein the second opening has a third width after the performing of the wet etching, and the third width of the second opening is substantially equal to the first width of the first opening.

8. The method of claim 7, wherein the etchant comprises $H_2O_2$ and $NH_4OH$.

9. The method of claim 7, further comprising monitoring a conductivity of the etchant during the performing of the wet etching, and ending the wet etching when the conductivity of the etchant is outside of a range.

10. The method of claim 9, wherein the range is between approximately 800 µS and 1300 µS.

11. The method of claim 7, wherein a difference between the second width of the second opening and the third width of the second opening is less than 2 nm.

12. The method of claim 7, wherein the protecting layer comprises a photoresist layer.

13. The method of claim 7, further comprising disposing an adjustment mark on the substrate.

14. The method of claim 13, wherein the adjustment mark has a fourth width prior to the performing of the wet etching, and the adjustment mark has a fifth width after the performing of the wet etching, and the fifth width is greater than the fourth width.

15. The method of claim 13, wherein the adjustment mark is exposed through the protecting layer.

16. The method of claim 13, wherein the adjustment mark includes an optimum exposure (EOP) mark.

17. A method for forming a photomask, comprising:
    receiving a substrate comprising a first layer and a patterned second layer, wherein the patterned second layer includes a dummy pattern;
    transferring the dummy pattern from the patterned second layer to the first layer, wherein the first layer has a first opening having a first width;
    removing the patterned second layer; and
    performing a wet etching to widen the first opening with an etchant, wherein the first opening has a second width greater than the first width after the performing of the wet etching.

18. The method of claim 17, wherein the dummy pattern includes a dummy critical dimension (CD) target pattern.

19. The method of claim 17, wherein the etchant is in contact with a top surface of the first layer and sidewalls of the first opening.

20. The method of claim 17, wherein the etchant has a lateral etching rate greater than a longitudinal etching rate.

* * * * *